(12) United States Patent
Takahashi

(10) Patent No.: US 10,818,216 B2
(45) Date of Patent: Oct. 27, 2020

(54) SEMICONDUCTOR DEVICE, DISPLAY PANEL, AND ELECTRONIC DEVICE

(71) Applicant: Semiconductor Energy Laboratory Co., Ltd., Atsugi-shi, Kanagawa-ken (JP)

(72) Inventor: Kei Takahashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 16/441,593

(22) Filed: Jun. 14, 2019

(65) Prior Publication Data

US 2019/0362668 A1 Nov. 28, 2019

Related U.S. Application Data

(63) Continuation of application No. 15/358,385, filed on Nov. 22, 2016, now Pat. No. 10,325,542.

(30) Foreign Application Priority Data

Nov. 30, 2015 (JP) .................... 2015-233540
Apr. 6, 2016 (JP) .................... 2016-076529

(51) Int. Cl.
*G09G 3/20* (2006.01)
*G06F 1/16* (2006.01)
(Continued)

(52) U.S. Cl.
CPC ........... *G09G 3/2007* (2013.01); *G06F 1/163* (2013.01); *G06F 1/1626* (2013.01); *G06F 3/041* (2013.01);
(Continued)

(58) Field of Classification Search
CPC ........ G06F 1/1626; G06F 1/163; G06F 3/041; G09G 2300/0828; G09G 2300/0842;
(Continued)

(56) References Cited

U.S. PATENT DOCUMENTS 7,948,418 B2 * 5/2011 Cho .................... G09G 3/20
341/145
8,462,145 B2 6/2013 Kim et al.
(Continued)

OTHER PUBLICATIONS

Jeon.Y et al., "A Piecewise-Linear 10b DAC Architecture with Drain-Current Modulation for Compact AMLCD Driver ICs", ISSCC 2009 (Digest of Technical Papers. IEEE International Solid-State Circuits Conference), Feb. 8, 2009, pp. 264-265,265a.

*Primary Examiner* — Afroza Chowdhury
(74) *Attorney, Agent, or Firm* — Fish & Richardson P.C.

(57) ABSTRACT

A grayscale voltage generator circuit that is less likely to be influenced by the offset voltage is provided. The grayscale voltage generator circuit is a semiconductor device that includes a D/A converter circuit, a first $G_m$ amplifier, a second $G_m$ amplifier, a current control circuit, an output buffer, and a selector circuit. The D/A converter circuit generates a first voltage and a second voltage from an upper bit of a digital signal. The current control circuit generates a first current from a lower bit of the digital signal and functions as a current source of the first $G_m$ amplifier. The output buffer generates a third voltage from currents output from the first $G_m$ amplifier and the second $G_m$ amplifier. The third voltage is input to the second $G_m$ amplifier. The selector circuit selects voltages that are to be input to the first $G_m$ amplifier and the second $G_m$ amplifier.

28 Claims, 28 Drawing Sheets

(51) Int. Cl.

| | | |
|---|---|---|
| *G09G 3/3291* | (2016.01) | |
| *G09G 3/36* | (2006.01) | |
| *G06F 3/041* | (2006.01) | |
| *G09G 3/3225* | (2016.01) | |
| *G09G 3/3266* | (2016.01) | |
| *H01L 27/12* | (2006.01) | |
| *H01L 27/32* | (2006.01) | |
| *H05K 5/00* | (2006.01) | |
| *G09G 3/3233* | (2016.01) | |

(52) U.S. Cl.
CPC ......... *G09G 3/3225* (2013.01); *G09G 3/3266* (2013.01); *G09G 3/3291* (2013.01); *G09G 3/3688* (2013.01); *H01L 27/1225* (2013.01); *H01L 27/3276* (2013.01); *H05K 5/0017* (2013.01); *H05K 5/0086* (2013.01); *G09G 3/2003* (2013.01); *G09G 3/3233* (2013.01); *G09G 3/3696* (2013.01); *G09G 2300/0828* (2013.01); *G09G 2300/0842* (2013.01); *G09G 2310/027* (2013.01); *G09G 2310/0289* (2013.01); *G09G 2310/0291* (2013.01); *G09G 2310/08* (2013.01); *G09G 2320/0233* (2013.01); *G09G 2330/028* (2013.01)

(58) Field of Classification Search
CPC ..... G09G 2310/027; G09G 2310/0289; G09G 2310/0291; G09G 2310/08; G09G 2320/0233; G09G 2330/028; G09G 3/2003; G09G 3/2007; G09G 3/3225; G09G 3/3233; G09G 3/3266; G09G 3/3291; G09G 3/3688; G09G 3/3696
See application file for complete search history.

(56) References Cited

U.S. PATENT DOCUMENTS

| | | | |
|---|---|---|---|
| 8,742,964 B2 | 6/2014 | Kleks et al. | |
| 10,325,542 B2* | 6/2019 | Takahashi | G06F 1/1626 |
| 2005/0140630 A1 | 6/2005 | Kikuchi et al. | |
| 2008/0089003 A1* | 4/2008 | Kojima | G09G 3/20 361/246 |
| 2009/0167667 A1* | 7/2009 | Suzuki | G09G 3/3688 345/96 |
| 2010/0141493 A1 | 6/2010 | Cho et al. | |
| 2010/0156867 A1 | 6/2010 | Kim et al. | |
| 2010/0271364 A1* | 10/2010 | Nishimura | G09G 3/3688 345/214 |
| 2010/0328289 A1* | 12/2010 | Enrin | G09G 3/3688 345/211 |
| 2017/0053584 A1 | 2/2017 | Takahashi | |
| 2017/0154560 A1* | 6/2017 | Takahashi | G06F 1/1626 |

* cited by examiner

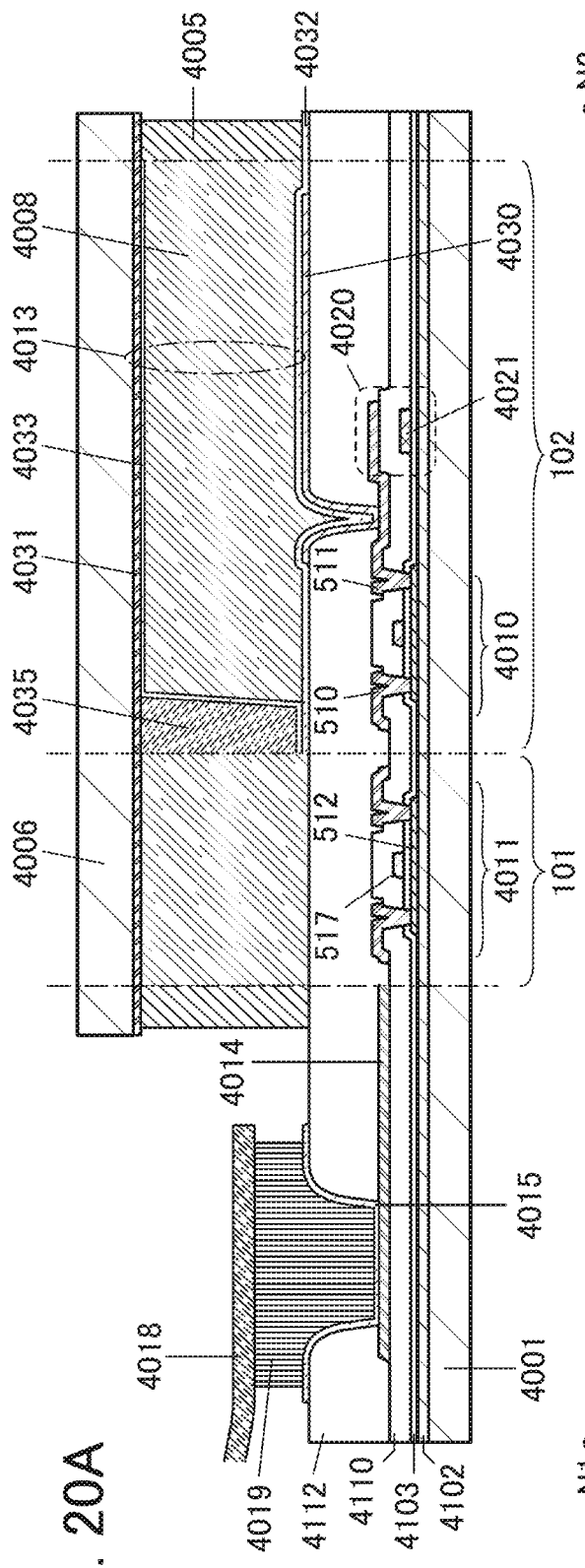
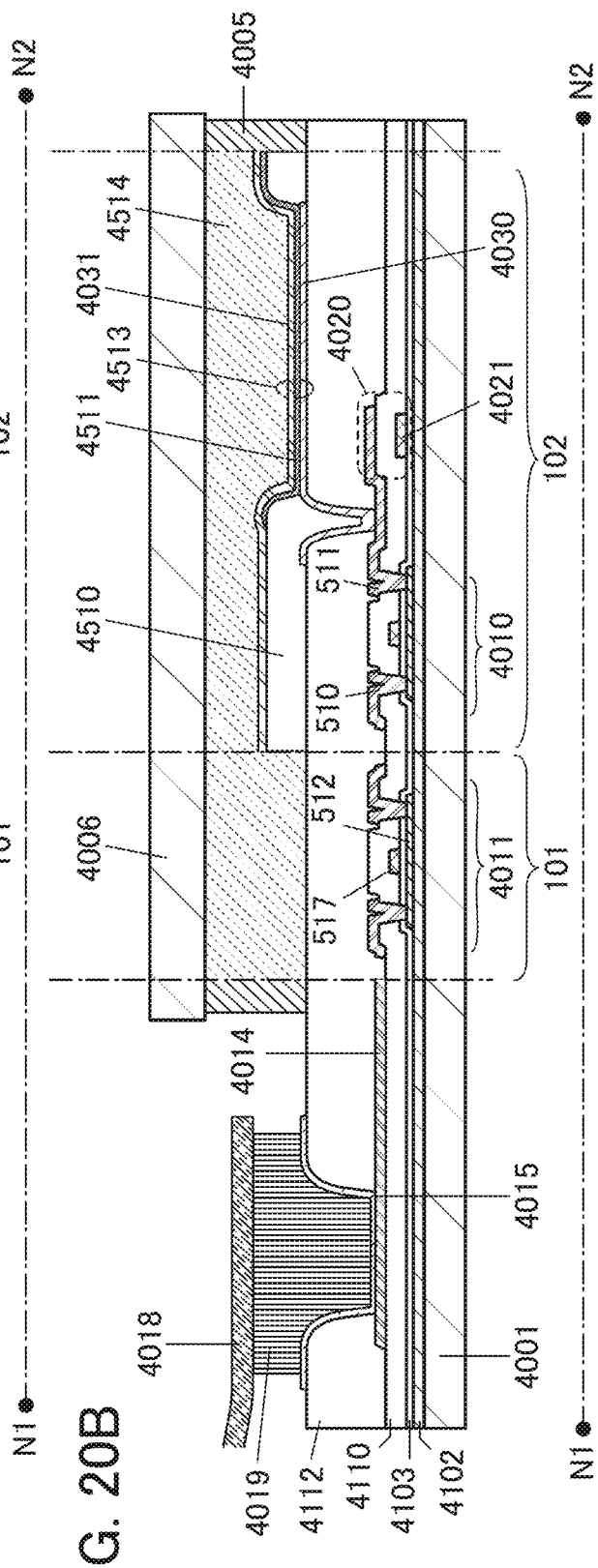
FIG. 20A
FIG. 20B

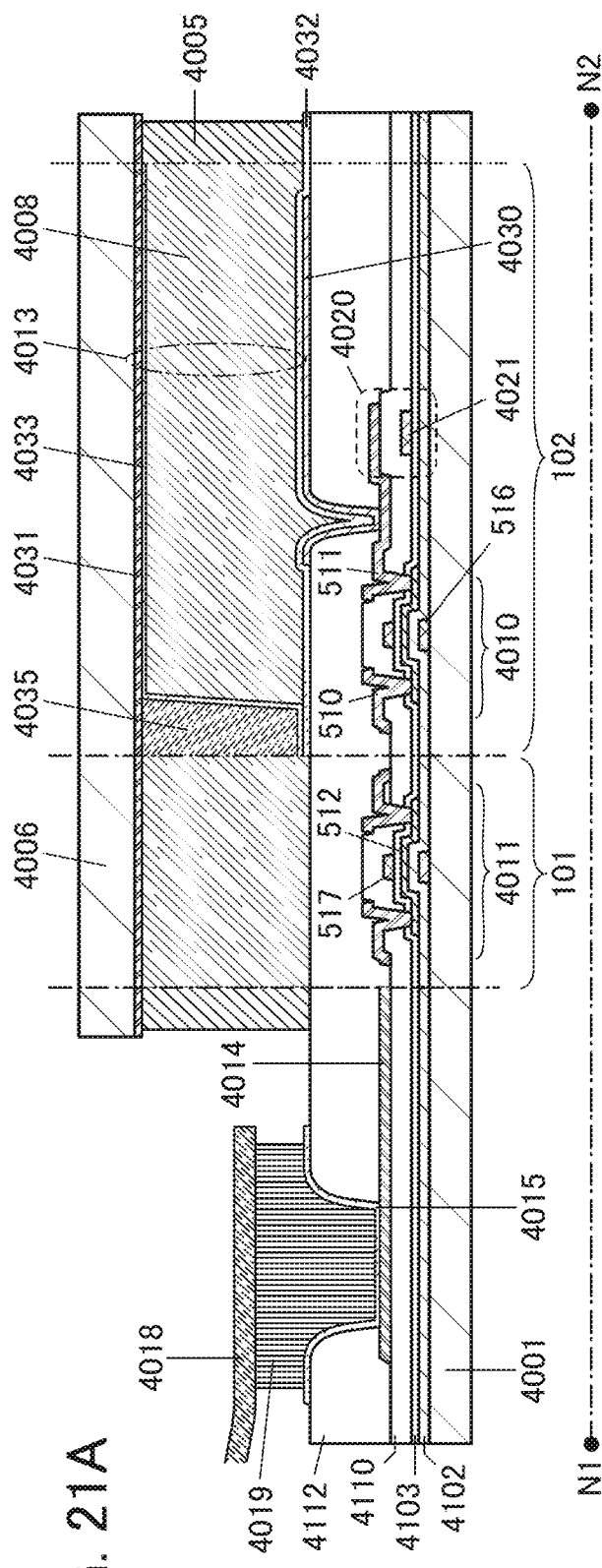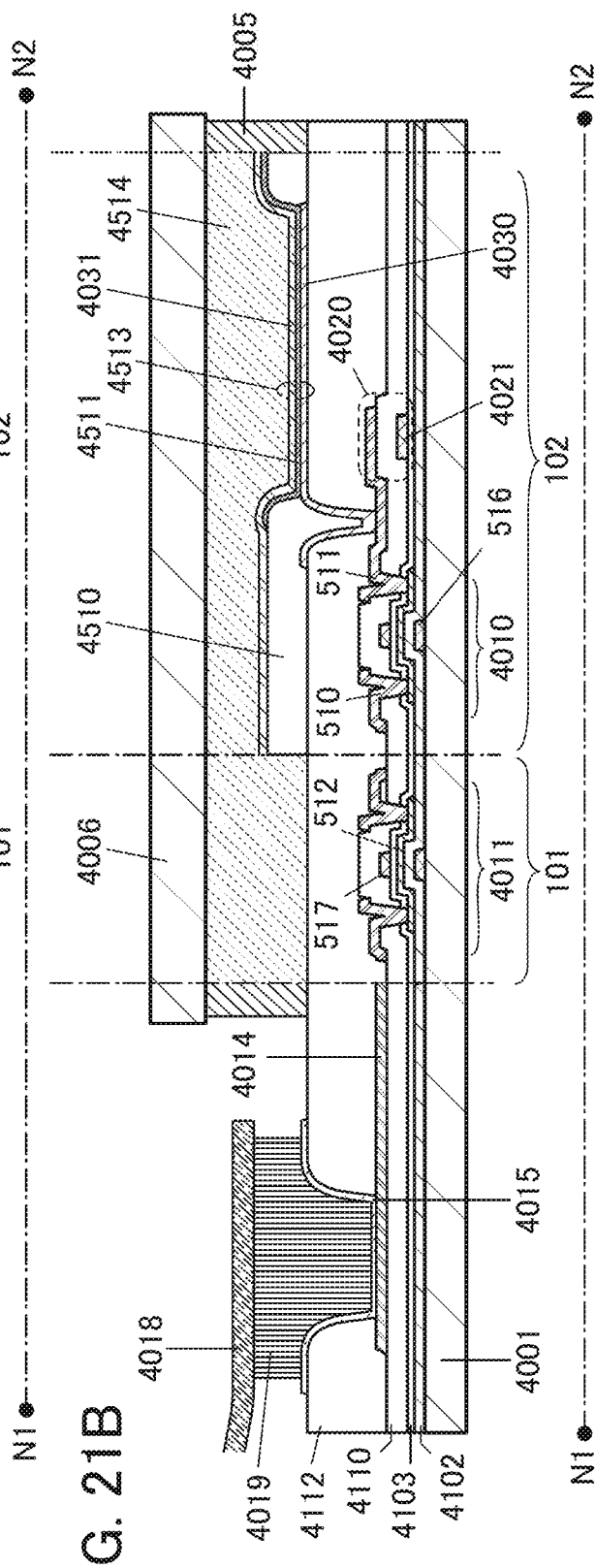

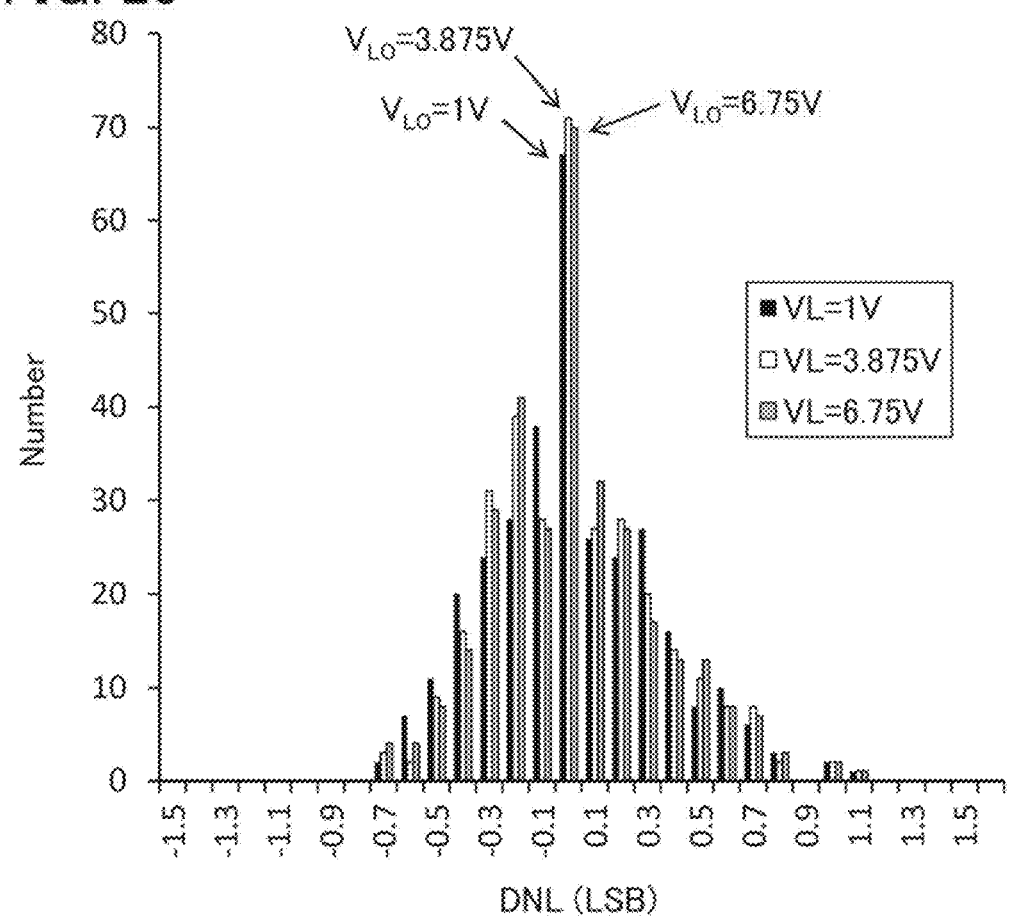

SEMICONDUCTOR DEVICE, DISPLAY PANEL, AND ELECTRONIC DEVICE

CROSS-REFERENCE TO RELATED APPLICATIONS

This application is a continuation of U.S. application Ser. No. 15/358,385, filed Nov. 22, 2016, now allowed, which claims the benefit of foreign priority applications filed in Japan as Serial No. 2016-076529 on Apr. 6, 2016 and Serial No. 2015-233540 on Nov. 30, 2015, all of which are incorporated by reference.

BACKGROUND OF THE INVENTION

1. Field of the Invention

One embodiment of the present invention relates to a semiconductor device, a display panel, and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device generally means a device that can function by utilizing semiconductor characteristics. A display device, a light-emitting device, an electro-optical device, a semiconductor circuit, and an electronic device include a semiconductor device in some cases.

2. Description of the Related Art

There has been a trend toward higher performance (e.g., multiple gray levels and higher definition) of display panels. To meet the demand for higher performance, an integrated circuit (IC, also referred to as a driver IC) is used as a driver circuit of a display panel, particularly as a signal line driver circuit (also referred to as a source driver).

A driver IC includes a grayscale voltage generator circuit for generating an analog signal supplied to pixels. The grayscale voltage generator circuit is what is called a digital-to-analog (D/A) converter circuit (DAC), which generates an analog signal from a digital signal.

As the D/A converter circuit, a resistor string DAC (R-DAC), in which resistors are provided in series, is used in consideration of the requirement of high-speed response. The number of switches in an R-DAC increases exponentially with an increase in the number of bits of digital signals; thus, the circuit area of a driver IC increases.

In view of the above, Patent Documents 1 to 3 suggest a structure in which an upper-bit digital signal and a lower-bit digital signal are independently converted into analog signals and a desired analog signal is synthesized from the analog signals.

REFERENCE

Patent Document

[Patent Document 1] United States Patent Application Publication No. 2005/0140630
[Patent Document 2] United States Patent Application Publication No. 2010/0156867
[Patent Document 3] United States Patent Application Publication No. 2010/0141493

SUMMARY OF THE INVENTION

As described above, there are a variety of structures of semiconductor devices functioning as grayscale voltage generator circuits. The structures have merits and demerits, and an appropriate structure is selected in accordance with circumstances. For example, when a current DAC is employed as in Patent Document 2, a switch is composed of a transistor with high withstand voltage. The increase in the number of switches due to the increase in the number of bits of digital signals causes a larger circuit area. Moreover, the increase in the number of switches due to a larger number of digital signal bits causes the increase in parasitic capacitance of an output portion, resulting in lower response speed.

In the structure described in Patent Document 3, an output analog signal is influenced by an offset voltage of an amplifier circuit. If the output voltage which is influenced by the offset voltage exceeds a desired grayscale voltage, monotonic increase of the output voltage might be lost and desired grayscale display might not be obtained.

An object of one embodiment of the present invention is to provide a grayscale voltage generator circuit which is less likely to be influenced by an offset voltage. An object of one embodiment of the present invention is to provide a grayscale voltage generator circuit with a small area. An object of one embodiment of the present invention is to provide a novel grayscale voltage generator circuit. An object of one embodiment of the present invention is to provide a display panel with improved display quality. An object of one embodiment of the present invention is to provide a novel semiconductor device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including a first amplifier circuit, a second amplifier circuit, a first circuit, a second circuit, and a third circuit. The first circuit is configured to generate a first voltage and a second voltage from an (N–M)-bit signal (N is a natural number of 2 or more and M is a natural number smaller than N) of an N-bit signal. The first voltage is higher than the second voltage. The second circuit is configured to generate a first current from an M-bit signal of the N-bit signal. The first current flows into the first amplifier circuit. The third circuit is configured to generate a third voltage from currents output from the first amplifier circuit and the second amplifier circuit. When the first voltage is supplied to a non-inverting input terminal of the first amplifier circuit, the second voltage is supplied to an inverting input terminal of the first amplifier circuit and a non-inverting input terminal of the second amplifier circuit, and the third voltage is supplied to an inverting input terminal of the second amplifier circuit. When the second voltage is supplied to the non-inverting input terminal of the first amplifier circuit, the first voltage is supplied to the inverting input terminal of the first amplifier circuit and the non-inverting input terminal of the second amplifier circuit, and the third voltage is supplied to the inverting input terminal of the second amplifier circuit.

In the above embodiment, the first amplifier circuit and the second amplifier circuit each function as a $G_m$ amplifier.

In the above embodiment, the first circuit preferably includes a plurality of resistors connected in series and a plurality of pass transistors.

One embodiment of the present invention is a display panel including the semiconductor device in any of the above embodiments and a display portion.

One embodiment of the present invention is a display module including the display panel in the above embodiment and a touch panel.

One embodiment of the present invention is an electronic device including the display panel in the above embodiment and at least one of an operation button, a speaker, and a microphone.

One embodiment of the present invention can provide a novel semiconductor device, a novel electronic device, or the like.

One embodiment of the present invention can provide a grayscale voltage generator circuit which is less likely to be influenced by an offset voltage. One embodiment of the present invention can provide a grayscale voltage generator circuit with a small area. One embodiment of the present invention can provide a novel grayscale voltage generator circuit. One embodiment of the present invention can provide a display panel with improved display quality. One embodiment of the present invention can provide a novel semiconductor device.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

In the accompanying drawings:

FIGS. 20A and 20B are cross-sectional views each illustrating a structure example of a display panel;

FIGS. 21A and 21B are cross-sectional views each illustrating a structure example of a display panel;

FIG. 25 shows a calculation result of differential non-linearity (DNL) by Monte Carlo simulation;

DETAILED DESCRIPTION OF THE INVENTION

Figure 1:
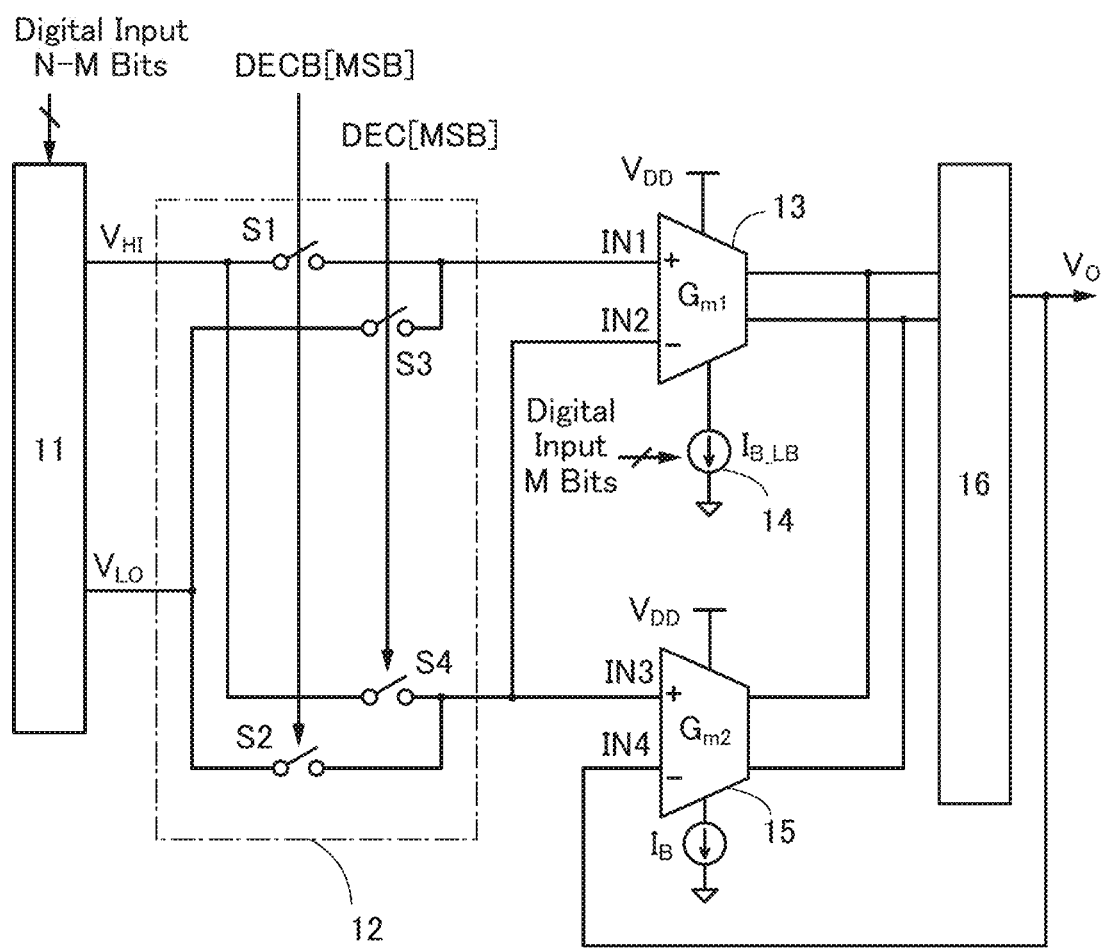
FIG. 1 is a circuit diagram illustrating a configuration example of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the same components, components having similar functions, components formed of the same material, or components formed at the same time are denoted by the same reference numerals in some cases, and description thereof is not repeated in some cases.

Furthermore, in the present specification, any of the embodiments and the examples below can be combined as appropriate. In addition, in the case where a plurality of structure examples is described in one embodiment, some of the structure examples can be combined as appropriate.

Embodiment 1

In this embodiment, an example of a semiconductor device functioning as a grayscale voltage generator circuit will be described.

<Semiconductor Device 10>

FIG. 1 is a circuit diagram illustrating an example of a circuit configuration for describing a semiconductor device 10. The semiconductor device 10 includes a digital-to-analog converter circuit (D/A converter circuit) 11, a selector circuit 12, an amplifier circuit 13, a current control circuit 14, an amplifier circuit 15, and an output buffer 16.

The amplifier circuit 13 is represented by a first $G_m$ amplifier or $G_{m1}$ in some cases. The amplifier circuit 15 is represented by a second $G_m$ amplifier or $G_{m2}$ in some cases.

The semiconductor device 10 has a function of converting an N-bit image signal (N is a natural number of 2 or more) into an analog signal represented by a voltage $V_O$ to output the analog signal.

The D/A converter circuit 11 is a circuit that converts an upper (N−M)-bit image signal (such a signal is hereinafter referred to as an upper-bit signal) of the N-bit signal into analog signals. Note that M is a natural number smaller than N. The D/A converter circuit 11 outputs a voltage $V_{HI}$ and a voltage $V_{LO}$ as the analog signals. The voltage $V_{HI}$ and the voltage $V_{LO}$ are determined on the basis of an upper-bit signal. The voltage $V_{HI}$ is higher than the voltage $V_{LO}$. The voltage $V_O$ output from the semiconductor device 10 is generated from the voltage $V_{HI}$ and the voltage $V_{LO}$.

The amplifier circuit 13 includes a terminal IN1 functioning as a non-inverting output terminal (+) and a terminal IN2 functioning as an inverting input terminal (−). The difference between a voltage supplied to the terminal IN1 and a voltage supplied to the terminal IN2 is referred to as a first difference, and a current flowing through the current control circuit 14 is referred to as a current $I_{B\_LB}$. The amplifier circuit 13 has a function of outputting a current in accordance with the first difference and the current $I_{B\_LB}$.

The amplifier circuit 15 includes a terminal IN3 functioning as a non-inverting output terminal (+) and a terminal IN4 functioning as an inverting input terminal (−). The difference between a voltage supplied to the terminal IN3 and a voltage supplied to the terminal 1N4 is referred to as a second difference. The amplifier circuit 15 has a function of outputting a current in accordance with the second difference. A current flowing through a current source included in the amplifier circuit 15 is referred to as current $I_B$.

A voltage $V_{DD}$ is supplied to the amplifier circuits 13 and 15 as the power supply voltage.

The current control circuit 14 has a function of generating a current $I_{B\_LB}$ from a lower M-bit image signal (hereinafter referred to as a lower-bit signal) of the N-bit signal. The current control circuit 14 functions as a current source of the amplifier circuit 13.

The output buffer 16 has a function of outputting the voltage $V_O$ in accordance with the currents output from the amplifier circuits 13 and 15.

The terminal IN3 of the amplifier circuit 15 is electrically connected to the terminal IN2 of the amplifier circuit 13. The voltage $V_O$ is supplied to the terminal IN4 of the amplifier circuit 15.

The selector circuit 12 includes switches and has a function of changing voltages input to the terminals IN to 1N3 by turning on and off these switches. For example, the selector circuit 12 in FIG. 1 includes switches S1 to S4. These switches are turned on and off in accordance with the most significant bit (DEC[MSB]) of the lower-bit signal and an inverted data thereof (DECB[MSB]).

In this specification, DEC[M:N] means DEC[M] to DEC[N], and DECB means an inverted data of DEC.

Figure 2:
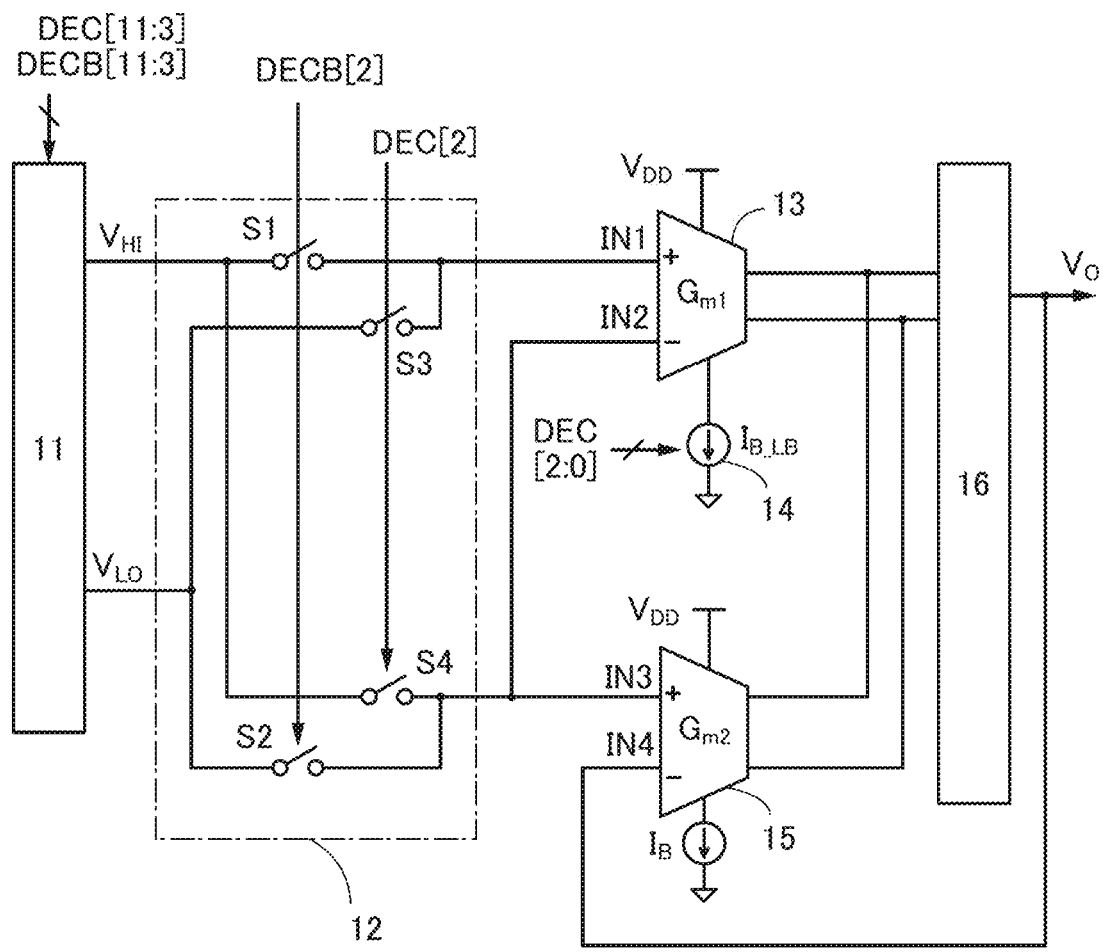
FIG. 2 is a circuit diagram illustrating a configuration example of a semiconductor device.

FIG. 2 shows an example in which the semiconductor device 10 performs processing in such a way that a 12-bit image signal (N=12) is divided into lower 3 bits (M=3) and upper 9 bits (N−M=9). In the semiconductor device 10, the upper-bit signals (DEC[11:3], DECB[11:3]) are input to the D/A converter circuit 11, the lower-bit signal (DEC[2:0]) is input to the current control circuit 14, and the most significant bit (DEC[2]) of the lower-bit signal and its inverted data (DECB[2]) are input to the selector circuit 12.

Next, operation of the semiconductor device 10 is described with reference to FIGS. 3A and 3B, FIGS. 4A and 4B, FIGS. 5A and 5B, FIGS. 6A and 6B, and FIGS. 7A and 7B. In the following description, the case similar to that in FIG. 2, i.e., the case where the semiconductor device 10 performs processing with lower 3 bits and upper 9 bits into which a 12-bit digital signal is divided, is described. However, the present invention is not limited thereto. The following description can also be applied to the case where a given N-bit digital signal is processed.

Figure 3A:
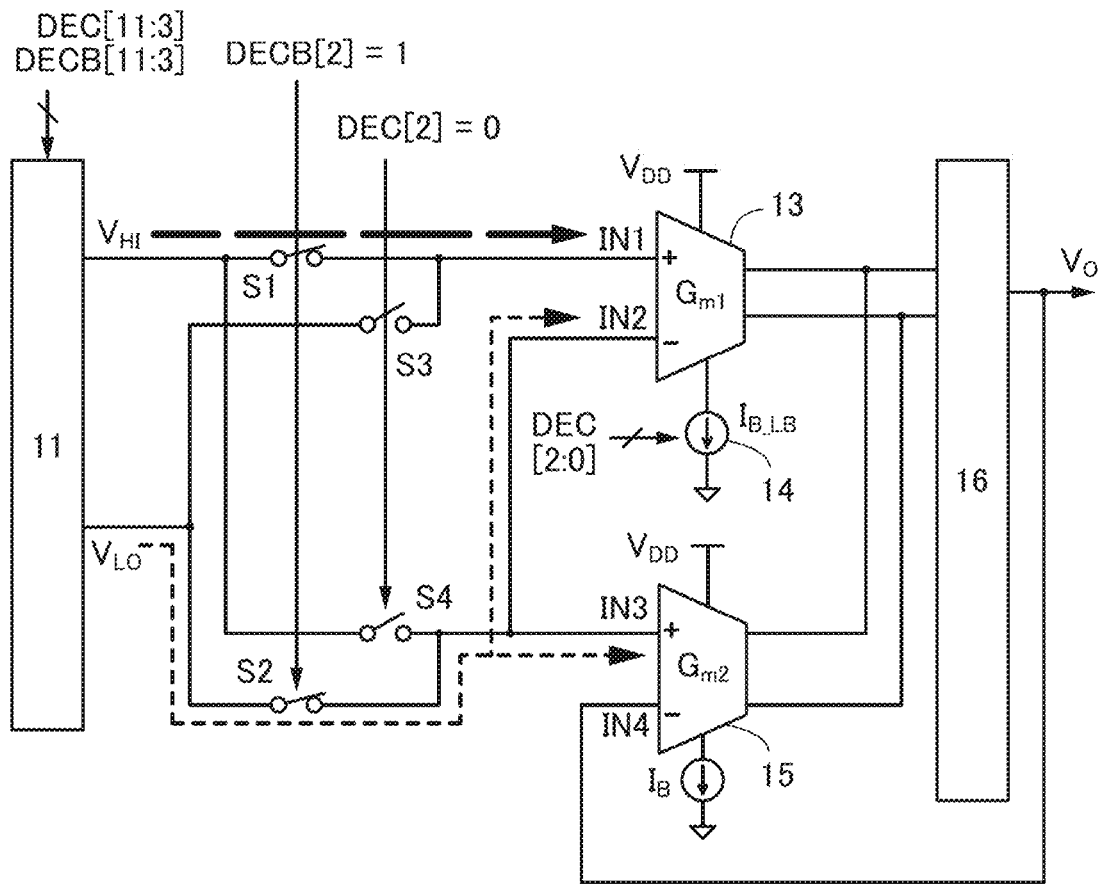
FIG. 3A is a circuit diagram showing operation of a semiconductor device.

FIG. 3A is a circuit diagram of the case where DEC[2]=0 and DECB[2]=1. In this case, the switch S1 and the switch S2 are turned on, and the switch S3 and the switch S4 are turned off. The voltage $V_{HI}$ is input to the terminal IN1, and the voltage $V_{LO}$ is input to the terminal IN2 and the terminal IN3.

Figure 3B:
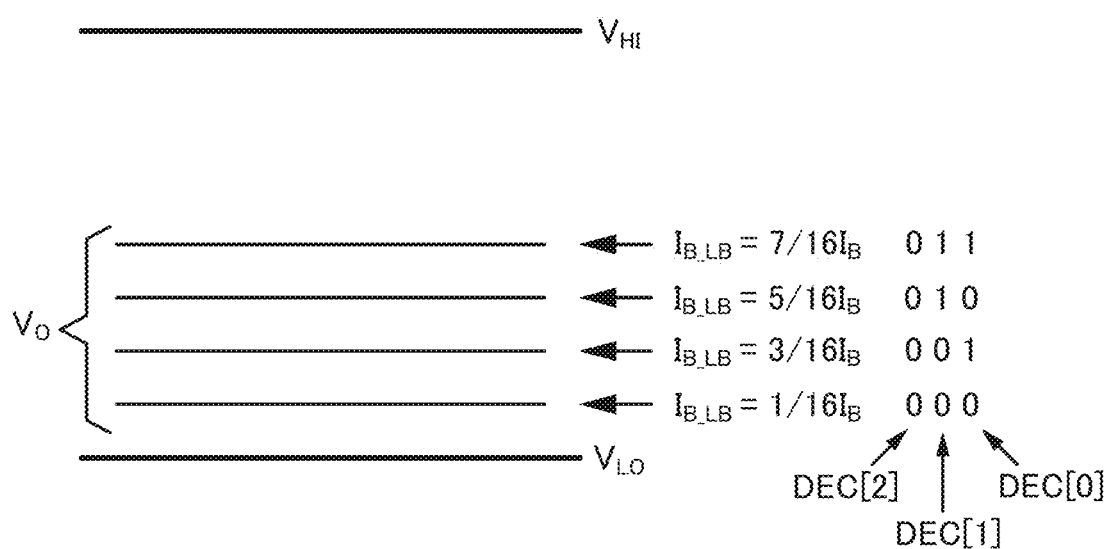
FIG. 3B shows a relation between an input digital signal and an output voltage.

As illustrated in FIG. 3B, the current control circuit 14 supplies one of four levels of the current $I_{B\_LB}$ in accordance with the lower-bit signal. At this time, as illustrated in FIG. 3B, the voltage $V_O$ can be one of four levels of voltage which is higher than the voltage $V_{LO}$ and lower than the intermediate voltage between the voltage $V_{LO}$ and the voltage $V_{HI}$.

Figure 4A:
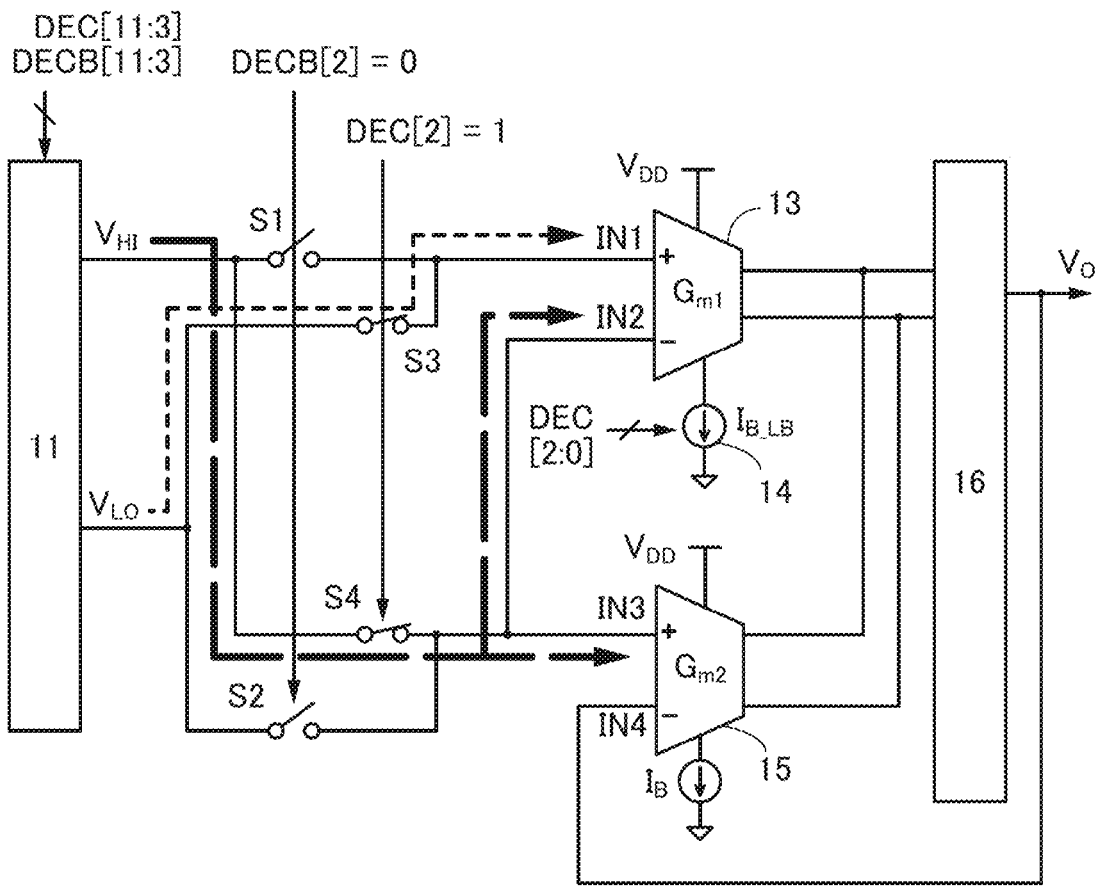
FIG. 4A is a circuit diagram showing operation of the semiconductor device.

FIG. 4A is a circuit diagram of the case where DEC[2]=1 and DECB[2]=0. In this case, the switch S1 and the switch S2 are turned off, and the switch S3 and the switch S4 are turned on. The voltage $V_{LO}$ is input to the terminal IN1, and the voltage $V_{HI}$ is input to the terminal IN2 and the terminal IN3.

Figure 4B:
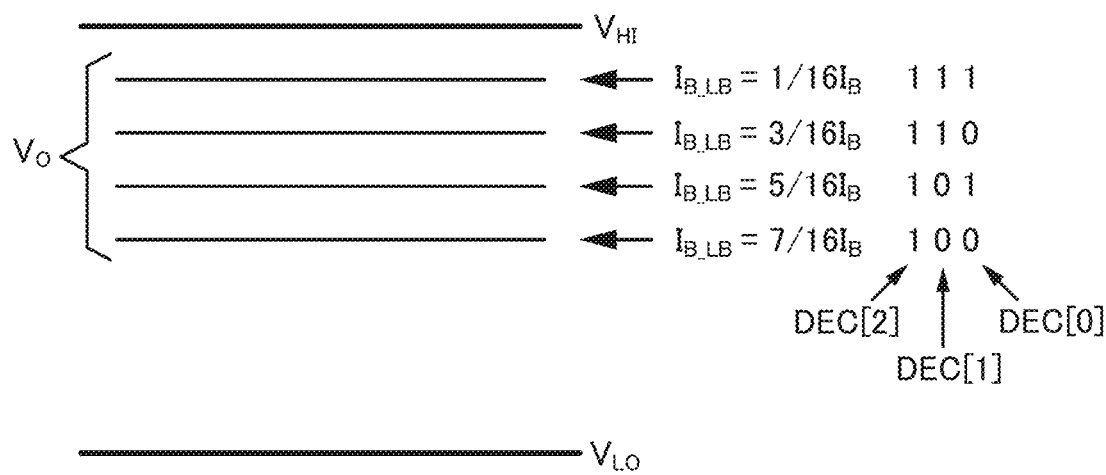
FIG. 4B shows a relation between an input digital signal and an output voltage.

As illustrated in FIG. 4B, the current control circuit 14 supplies one of four levels of the current $I_{B\_LB}$ in accordance with the lower-bit signal. At this time, as illustrated in FIG. 4B, the voltage $V_O$ can be one of four levels of voltage which is lower than the voltage $V_{HI}$ and higher than the intermediate voltage between the voltage $V_{LO}$ and the voltage $V_{HI}$.

Figure 5A:
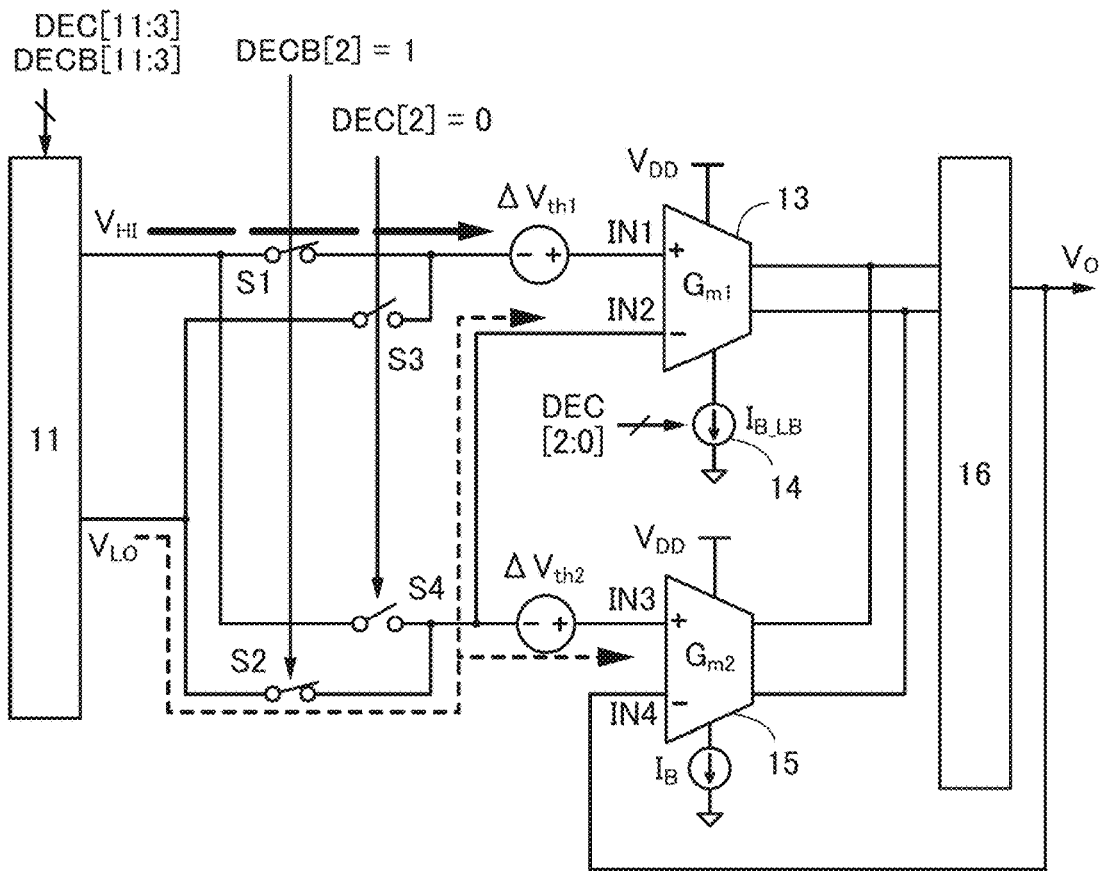
FIG. 5A is a circuit diagram showing operation of the semiconductor device.

Next, the influence of offset voltages generated in the amplifier circuits 13 and 15 on the semiconductor device 10 is described with reference to FIGS. 5A and 5B, FIGS. 6A and 6B, and FIGS. 7A and 7B. FIG. 5A and FIG. 6A are circuit diagrams each illustrating the case where an offset voltage $\Delta V_{th1}$ exists in the terminal IN1 of the amplifier circuit 13 and an offset voltage $\Delta V_{th2}$ exists in the terminal IN3 of the amplifier circuit 15.

First, with reference to FIG. 5A, the case where DEC[2]=0 and DECB[2]=1 is described.

In FIG. 5A, the voltage $V_O$ can be expressed by the following formula (1). Note that $G_{m1}$ represents transconductance of the amplifier circuit 13 and $G_{m2}$ represents transconductance of the amplifier circuit 15 in the formula (1) and a formula (2).

$$V_O = V_{LO} + G_{m1}/G_{m2} \times (V_{HI} - V_{LO} + \Delta V_{th1}) \tag{1}$$

Figure 5B:
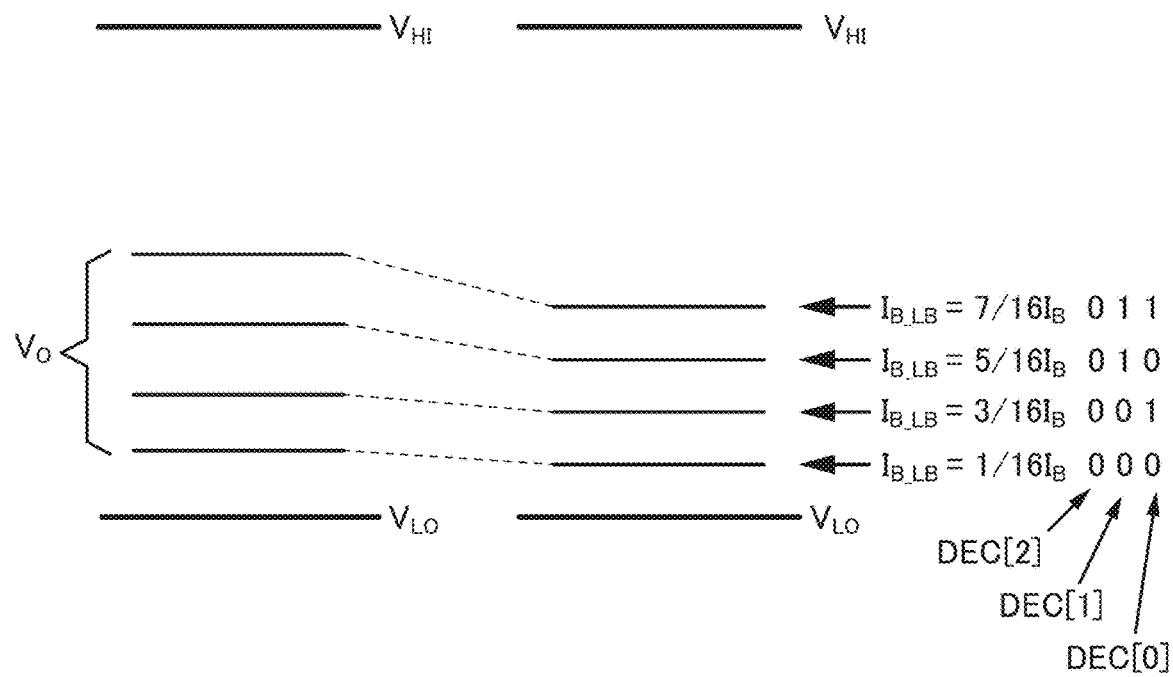
FIG. 5B shows a relation between an input digital signal and an output voltage.
Figure 6A:
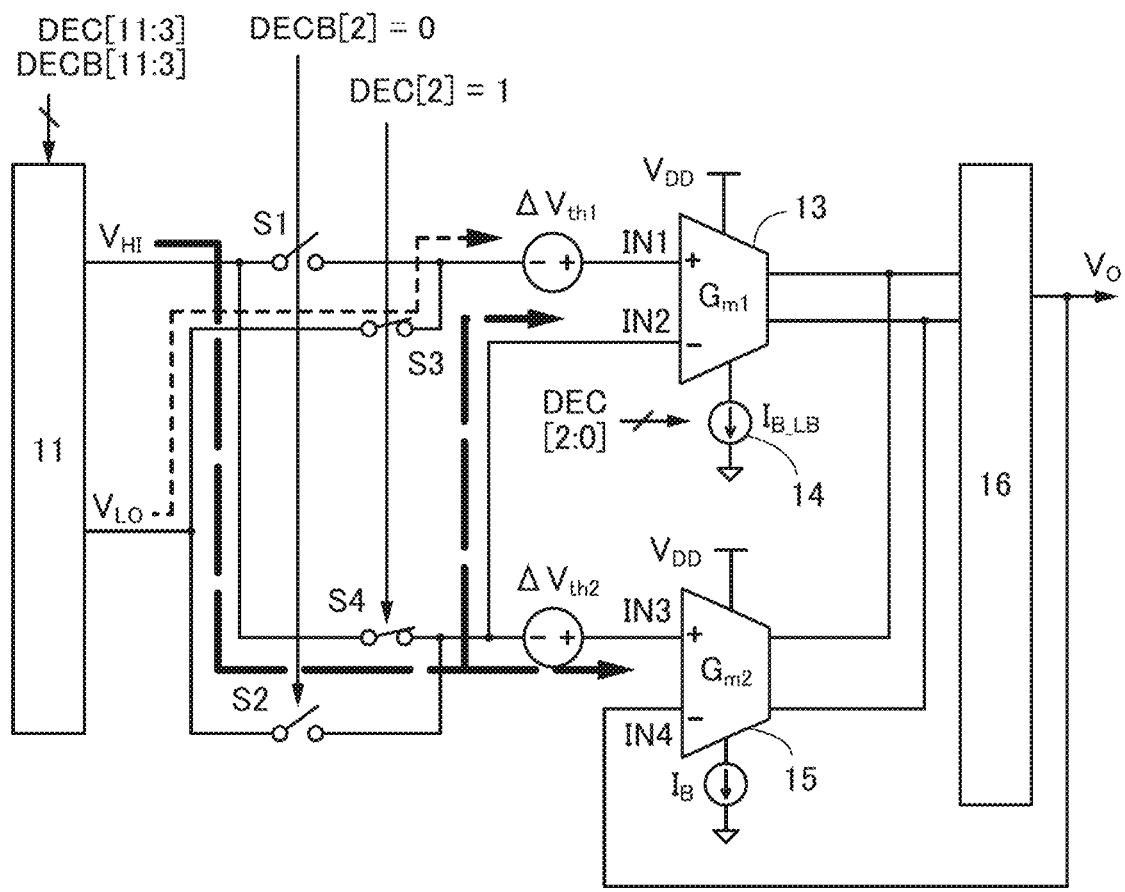
FIG. 6A is a circuit diagram showing operation of the semiconductor device.

It is shown from the formula (1) that the voltage $V_O$ when the offset voltage $\Delta V_{th1}$ exists (left part of FIG. 5B) shifts toward a higher voltage side than the voltage $V_O$ when the offset voltage $\Delta V_{th1}$ does not exist (right part of FIG. 5B). Since the voltage $V_O$ is proportional to $G_{m1}$ and $G_{m1}$ is proportional to the current $I_{B\_LB}$, the amount of shift caused by the offset voltage $\Delta V_{th1}$ is maximized with the largest current $I_{B\_LB}=7/16\times I_B$ in FIG. 5B.

Next, with reference to FIG. 6A, the case where DEC[2]=1 and DECB[2]=0 is described.

In FIG. 6A, the voltage $V_O$ can be expressed by the following formula.

$$V_O=V_{HI}+G_{m1}/G_{m2}\times(-V_{HI}+V_{LO}+\Delta V_{th1}) \quad (2)$$

Figure 6B:
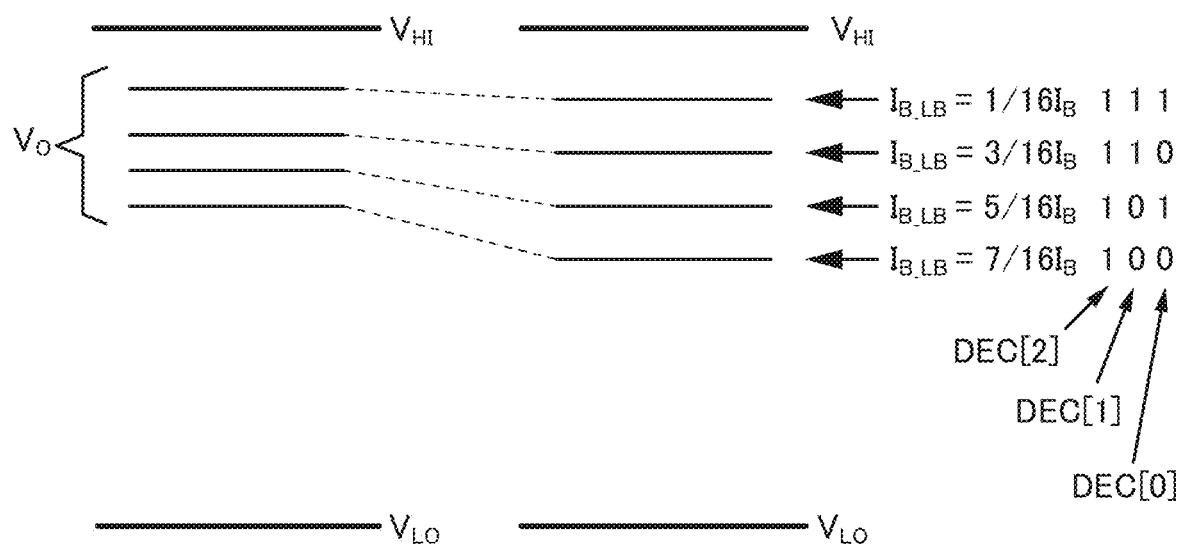
FIG. 6B shows a relation between an input digital signal and an output voltage.

It is shown from the formula (2) that the voltage $V_O$ when the offset voltage $\Delta V_{th1}$ exists (left part of FIG. 6B) shifts toward a higher voltage side than the voltage $V_O$ when the offset voltage $\Delta V_{th1}$ does not exist (right part of FIG. 6B). Since the voltage $V_O$ is proportional to $G_{m1}$ and $G_{m1}$ is proportional to the current $I_{B\_LB}$, the amount of shift caused by the offset voltage $\Delta V_{th1}$ is maximized with the largest current $I_{B\_LB}=7/16\times I_B$ in FIG. 6B.

Figure 7A:
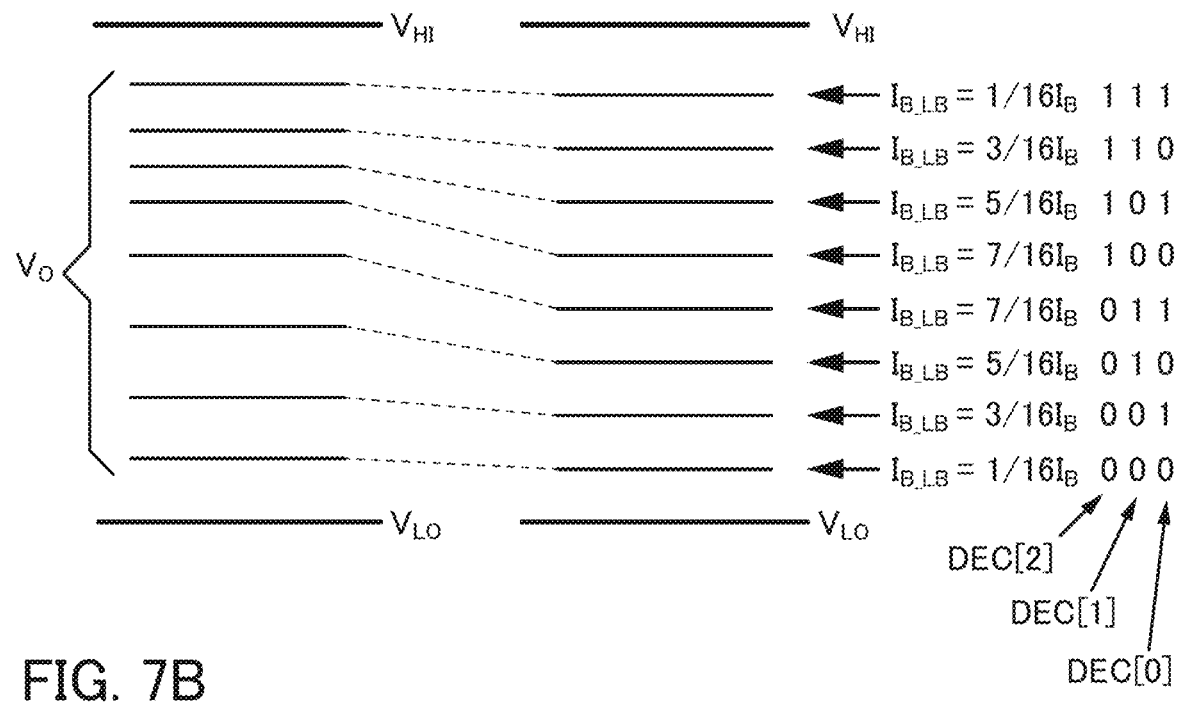
FIGS. 7A and 7B each show a relation between an input digital signal and an output voltage.

FIG. 5B and FIG. 6B are integrated into FIG. 7A. FIG. 7A shows that the magnitude of the voltages $V_O$ can be kept even when the offset voltage $\Delta V_{th1}$ exists.

The offset voltage $\Delta V_{th2}$ existing in the amplifier circuit 15 does not influence voltage generation based on the lower-bit signal. In other words, the offset voltage $\Delta V_{th2}$ does not influence the magnitude of the voltages $V_O$ shown in FIG. 7A.

Figure 7B:
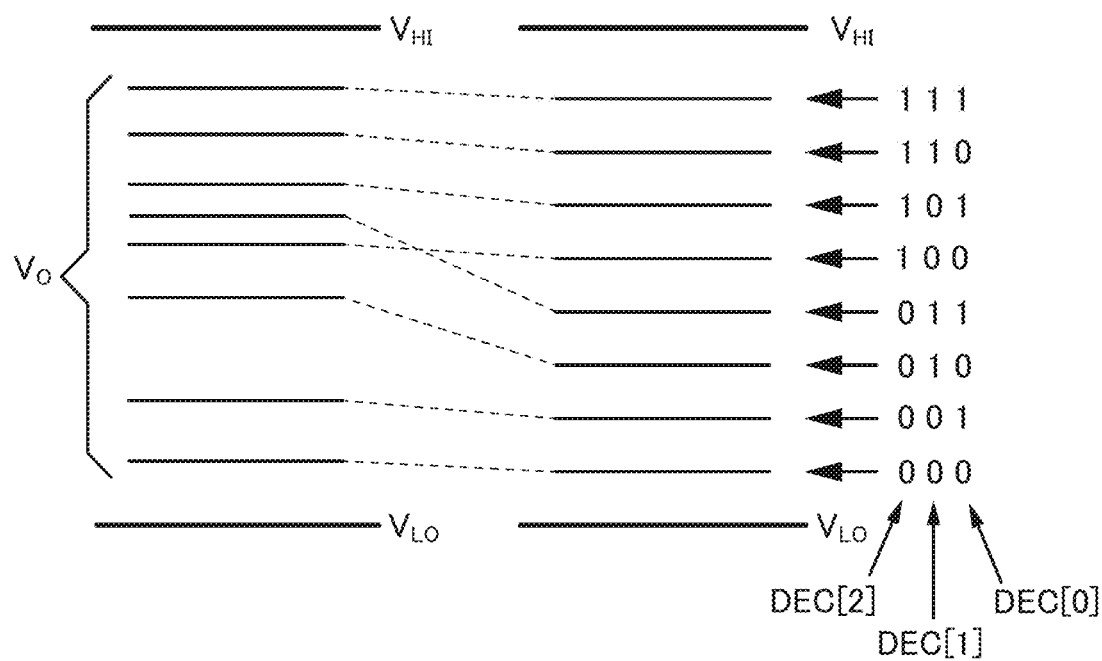

The case where the semiconductor device 10 is used as a grayscale voltage generator circuit of a display panel is described. An image signal containing color data of a pixel is input to the semiconductor device 10 as a digital signal and then output as the voltage $V_O$ which is an analog signal. If the voltages $V_O$ corresponding to respective sets of DEC[0] to DEC[2] are not in appropriate order as illustrated in FIG. 7B, grayscale inversion occurs and pixels of a display panel cannot display proper colors.

As described above, the semiconductor device 10 can keep the correspondence relation between the image signal and the voltage $V_O$ even when the offset voltage exists. In other words, a display panel including the semiconductor device 10 has favorable display quality.

<Amplifier Circuit 13, Amplifier Circuit 15, and Output Buffer 16>

Figure 8:
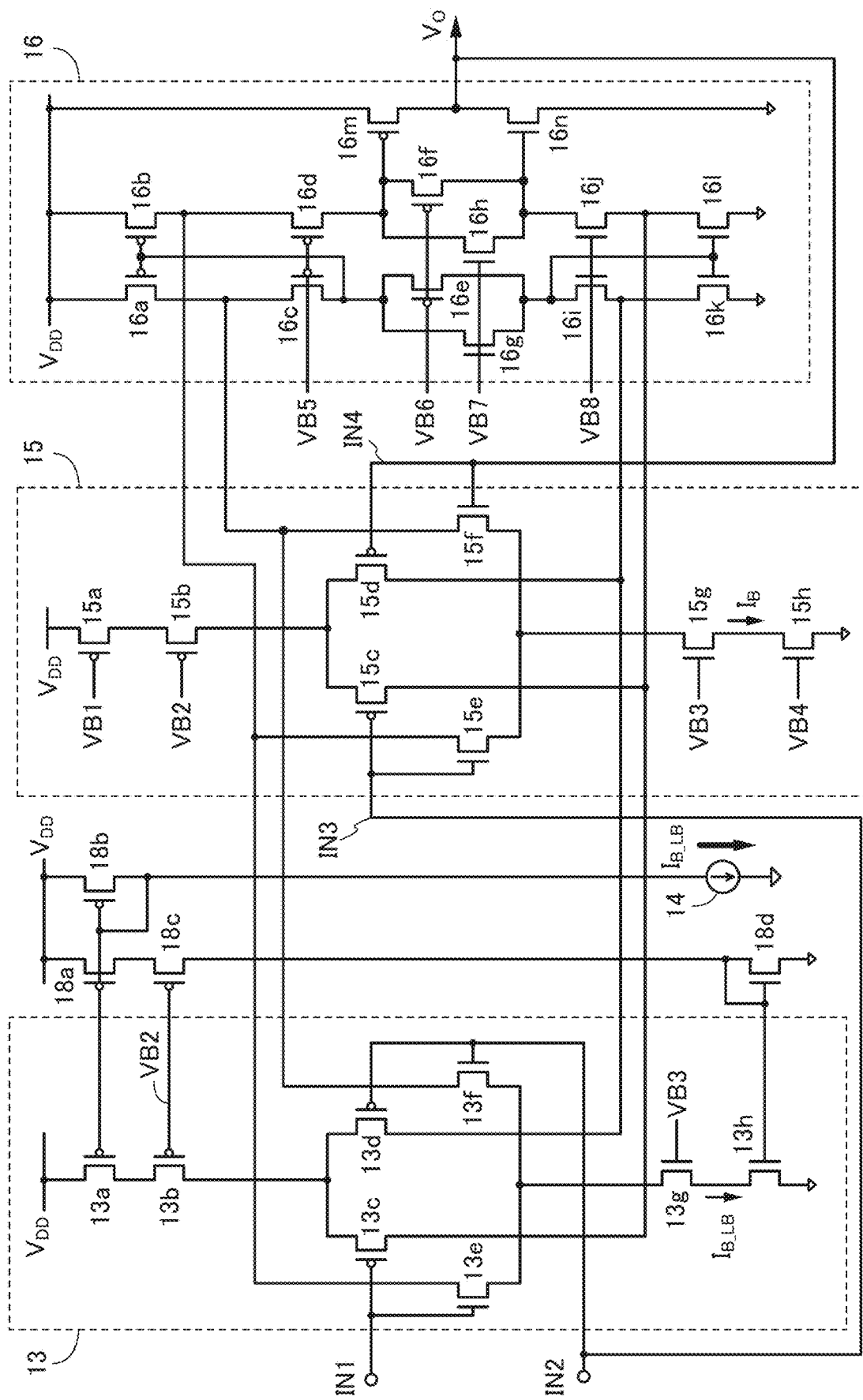
FIG. 8 is a circuit diagram illustrating a configuration example of an amplifier circuit 13, an amplifier circuit 15, and an output buffer 16.

FIG. 8 shows an example of a circuit configuration of the amplifier circuit 13, the amplifier circuit 15, and the output buffer 16.

The amplifier circuit 13 includes transistors 13a to 13h. The terminal IN1 is electrically connected to gates of the transistors 13c and 13e. The terminal IN2 is electrically connected to gates of the transistors 13d and 13f. The amplifier circuit 13 has a circuit configuration of a differential amplifier circuit. A voltage VB2 is supplied to a gate of the transistor 13b. A voltage VB3 is supplied to a gate of the transistor 13g.

Transistors 18a to 18d and the amplifier circuit 13 in FIG. 8 form a current mirror circuit. The transistors 18a to 18d have a function of transmitting the current $I_{B\_LB}$ generated in the current control circuit 14 to the amplifier circuit 13.

The amplifier circuit 15 includes transistors 15a to 15h. The terminal IN3 is electrically connected to gates of the transistors 15c and 15e. The terminal IN4 is electrically connected to gates of the transistors 15d and 15f. The amplifier circuit 15 has a circuit configuration of a differential amplifier circuit. A voltage VB1 is supplied to a gate of the transistor 15a. The voltage VB2 is supplied to a gate of the transistor 15b. The voltage VB3 is supplied to a gate of the transistor 15g. A voltage VB4 is supplied to a gate of the transistor 15h. The terminal IN3 is electrically connected to the terminal 1N2 of the amplifier circuit 13. The terminal IN4 is electrically connected to an output terminal of the output buffer 16.

The output buffer 16 includes transistors 16a to 16n. A voltage VB5 is supplied to gates of the transistors 16c and 16d. A voltage VB6 is supplied to gates of the transistors 16e and 16f. A voltage VB7 is supplied to gates of the transistors 16g and 16h. A voltage VB8 is supplied to gates of the transistors 16i and 16j.

<Current Control Circuit 14>

Figures 9A, 9B:
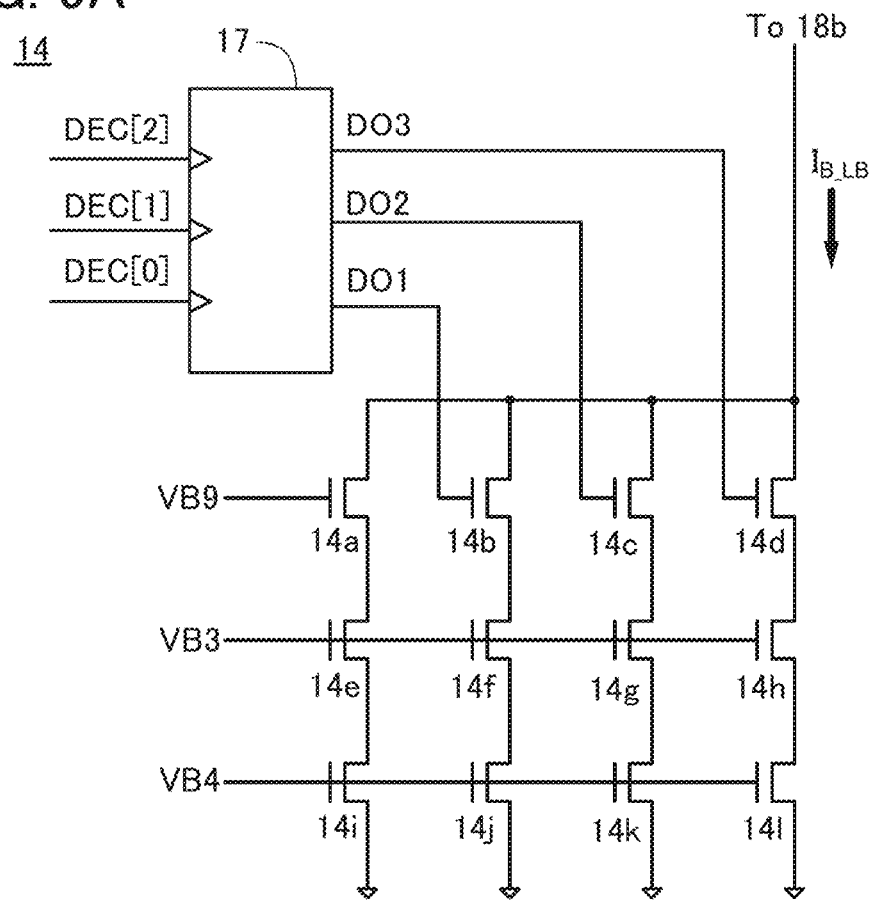
FIG. 9A is a circuit diagram illustrating a configuration example of a current control circuit 14.
FIG. 9B is a conversion table.

FIG. 9A shows an example of a circuit configuration of the current control circuit 14. The current control circuit 14 has a function of generating the current $I_{B\_LB}$ from the lower-bit signal DEC[2:0].

The current control circuit 14 includes a decoder 17 and transistors 14a to 14l. A voltage VB9 is supplied to a gate of the transistor 14a. The voltage VB3 is supplied to gates of the transistors 14e to 14h. The voltage VB4 is supplied to gates of the transistors 14i to 14l.

The decoder 17 converts DEC[2:0] into signals DO1 to DO3. The signal DO1 is supplied to a gate of the transistor 14b. The signal DO2 is supplied to a gate of the transistor 14c. The signal DO3 is supplied to a gate of the transistor 14d.

FIG. 9B shows a conversion table describing generation of the signals DO1 to DO3 from DEC[2:0] in the decoder 17. The transistors 14b, 14c, and 14d are turned on and off by the decoder 17 in accordance with the conversion table in FIG. 9B. The current control circuit 14 has a function of generating the current $I_{B\_LB}$ from the digital signal DEC[2:0].

The mode of the current control circuit 14 is not limited to the above. For example, a resistor string DAC or a resistor ladder DAC may be used as the current control circuit 14 and the current $I_{B\_LB}$ may be generated from the lower-bit signal.

<D/A Converter Circuit 11>

Figure 10:
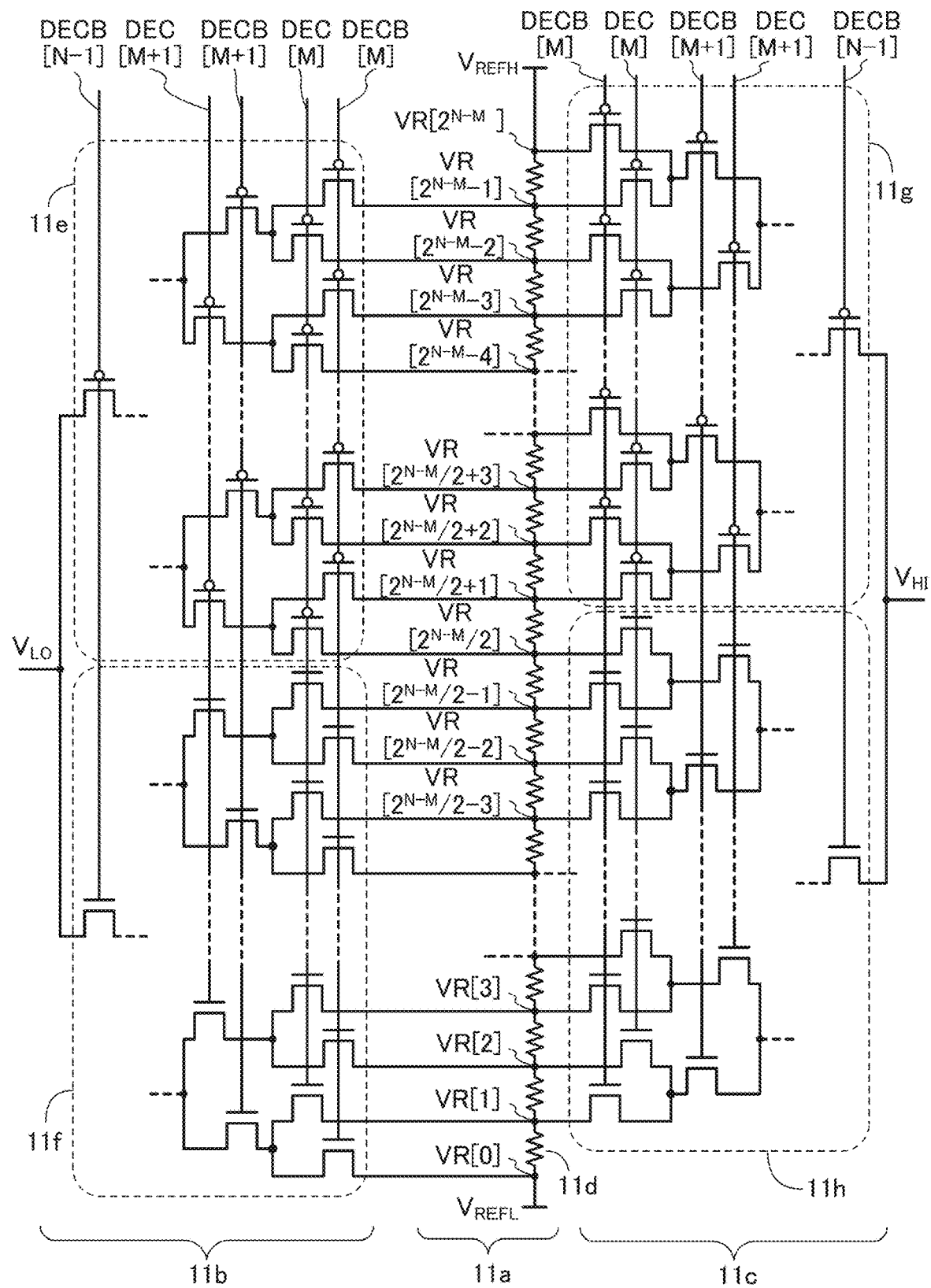
FIG. 10 is a circuit diagram illustrating a configuration example of a D/A converter circuit.

The D/A converter circuit 11 in FIG. 10 includes a voltage generator circuit 11a, a pass transistor logic (PTL) 11b, and a PTL 11c.

The voltage generator circuit 11a includes a plurality of resistors 11d. The voltage generator circuit 11a is supplied with voltages $V_{REFH}$ and $V_{REFL}$ ($V_{REFH}>V_{REFL}$) to generate a plurality of voltages VR[0] to VR[$2^{N-M}$].

The PTL 11b includes a plurality of p-channel transistors 11e and a plurality of n-channel transistors 11f. The PTL 11c includes a plurality of p-channel transistors 11g and a plurality of n-channel transistors 11h. Among the voltages VR[0] to VR[$2^{N-M}$], the voltages VR[$2^{N-M}/2$] to VR[$2^{N-M}-1$] are input to the transistors 11e, the voltages VR[0] to VR[$2^{N-M}/2-1$] are input to the transistors 11f, the voltages VR[$2^{N-M}2+1$] to VR[$2^{N-M}$] are input to the transistors 11g, and the voltages VR[1] to VR[$2^{N-M}/2$] are input to the transistors 11h.

The transistors 11e to 11h are pass transistors and function as switches. Each of the switches is switched on or off in accordance with an upper-bit signal. The PTL 11b and the PTL 11c each have a function of selecting a desired voltage among the voltages VR[0] to VR[$2^{N-M}$] to be output by switching of the switches. The PTL 11b has a function of outputting the voltage $V_{LO}$, and the PTL 11c has a function of outputting the voltage $V_{HI}$. The voltages $V_{HI}$ and $V_{LO}$ are analog voltages based on an upper-bit signal. As described above, the voltages $V_{HI}$ and $V_{LO}$ are converted into voltages based on a lower-bit signal in a circuit in a later stage.

The D/A converter circuit 11 is an R-DAC including resistors provided in series. Although an R-DAC can perform D/A conversion at high speed, an increase in the number of bits of a digital signal causes an increase in an area occupied by the circuit. However, in the semiconductor device 10 of one embodiment of the present invention, only an upper-bit signal of a digital signal is allocated to the R-DAC, so that the area occupied by the circuit can be reduced.

Figure 11:
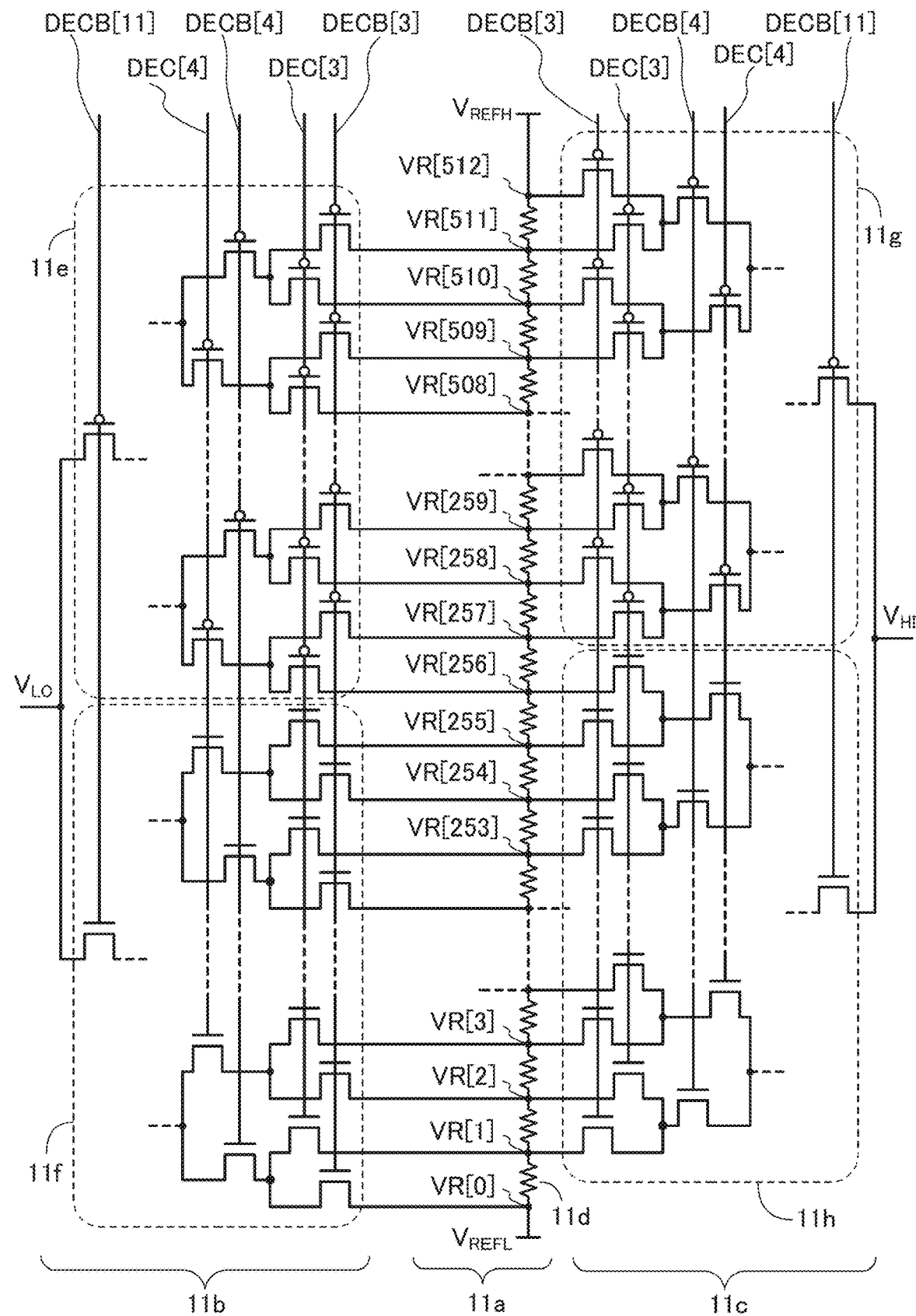
FIG. 11 is a circuit diagram illustrating a configuration example of a D/A converter circuit.

FIG. 11 illustrates an example in which the D/A converter circuit 11 converts the upper 9 bits (N=12, M=3, N−M=9) of a 12-bit digital signal into an analog signal. Among voltages VR[0] to VR[512], the voltages VR[256] to VR[511] are input to the transistors 11e, the voltages VR[0] to VR[255] are input to the transistors 11f, the voltages VR[257] to VR[512] are input to the transistors 11g, and the voltages VR[1] to VR[256] are input to the transistors 11h.

As described above, when the semiconductor device 10 is used as a grayscale voltage generator circuit, the grayscale voltage generator circuit can be less likely to be influenced by an offset voltage and have small area. In addition, a display panel including the grayscale voltage generator circuit can have improved display quality.

Embodiment 2

Figure 12:
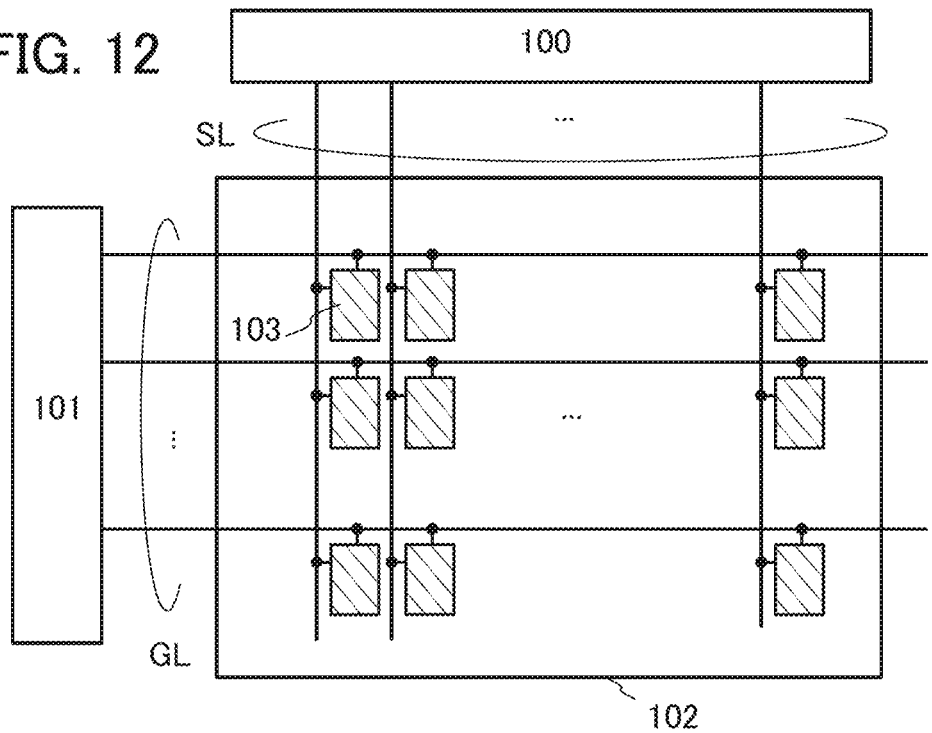
FIG. 12 is a circuit block diagram illustrating a configuration example of a display panel.

In this embodiment, a display panel including the semiconductor device 10 described in Embodiment 1 is described.
<Block Diagram of Display Panel>
A display panel in a block diagram of FIG. 12 includes a signal line driver circuit 100, a scan line driver circuit 101, and a pixel portion 102. In the pixel portion 102, pixels 103 are arranged in a matrix. The pixel portion 102 may be referred to as a display portion.

The signal line driver circuit 100 has a function of outputting an image signal that has been converted into an analog signal to a plurality of signal lines SL.

A circuit included in the signal line driver circuit 100 may be an IC or may be formed using the same transistor as that in the pixel 103 in the pixel portion 102. Note that a plurality of signal line driver circuits 100 may be provided to control the signal lines SL separately.

The scan line driver circuit 101 has a function of outputting scan signals to scan lines GL. The scan line driver circuit 101 includes a shift register and a buffer, for example. The scan line driver circuit 101 receives a gate start pulse, a gate clock signal, and the like and outputs a pulse signal.

A circuit included in the scan line driver circuit 101 may be an IC or may be formed using the same transistor as that in the pixel 103 in the pixel portion 102. Note that a plurality of scan line driver circuits 101 may be provided to control the scan lines GL separately.

Figure 13:
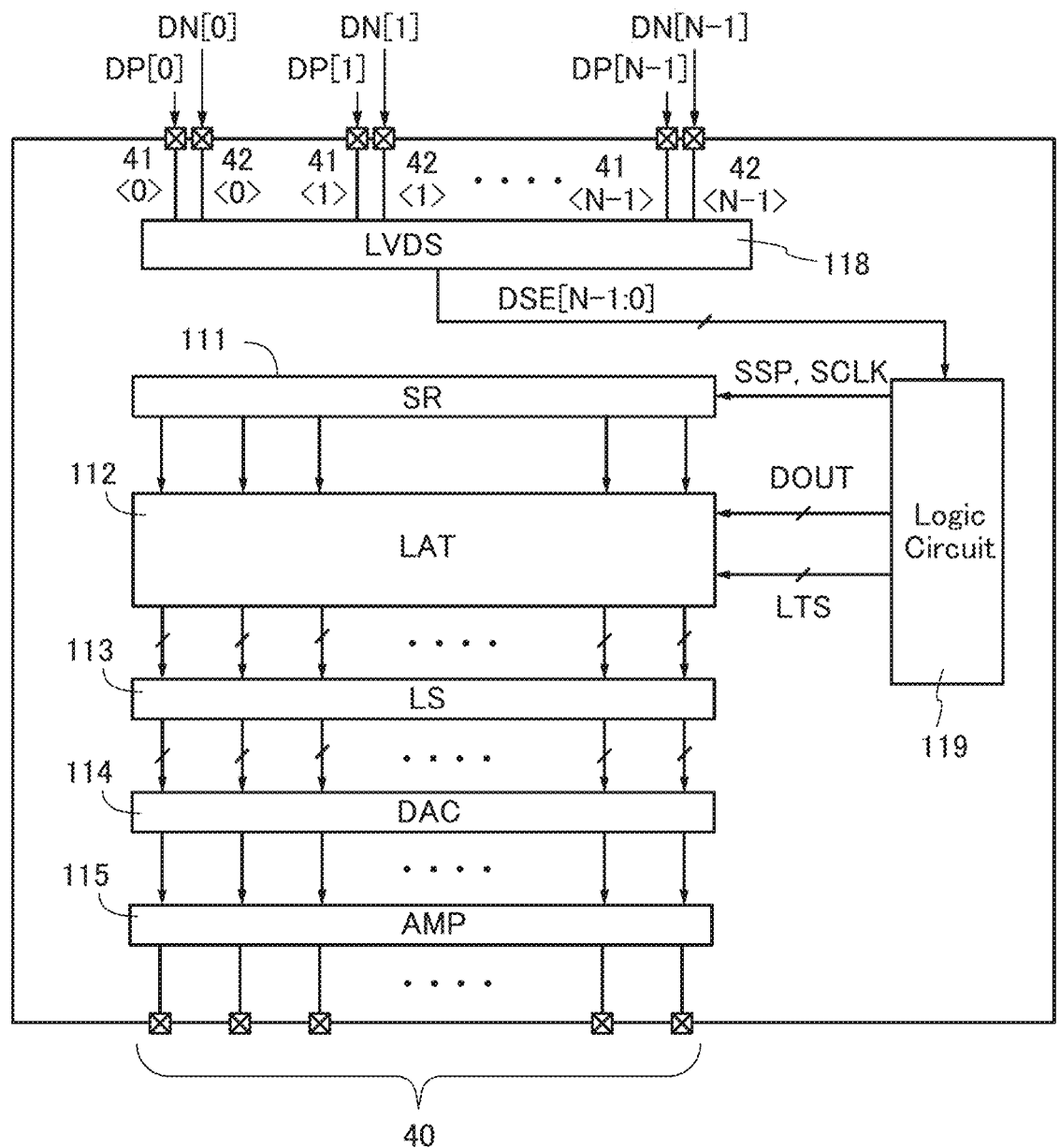
FIG. 13 is a circuit block diagram illustrating a configuration example of a signal line driver circuit.

In the pixel portion 102, the scan lines GL and the signal lines SL are provided to intersect at substantially right angles. The pixel 103 is provided at the intersection of the scan line GL and the signal line SL. For color display, the pixels 103 corresponding to the respective colors of red, green, and blue (RGB) are arranged in sequence in the pixel portion 102. Note that the pixels of RGB can be arranged in a stripe pattern, a mosaic pattern, a delta pattern, or the like as appropriate. Without limitation to RGB, white, yellow, or the like may be added to RGB for color display.
<Signal Line Driver Circuit 100>
Next, the signal line driver circuit 100 is described in detail with reference to FIG. 13. A circuit block diagram in FIG. 13 shows a configuration example of the signal line driver circuit 100 capable of processing an N-bit image signal.

The signal line driver circuit 100 includes terminals 40, terminals 41, terminals 42, a low-voltage differential signaling (LVDS) receiver 118, a logic circuit 119, a shift register 111, a latch circuit 112, a level shifter 113, a D/A converter circuit 114, and an amplifier circuit 115.

The terminals 40 are output terminals for an image signal that has been converted into an analog signal, and are electrically connected to the signal lines SL. The terminals 41 and 42 are input terminals for differential signals. For example, a signal whose logic is inverted with respect to that of an input signal of the terminal 41<1> is input to the terminal 42<1>. For example, image signals DP[0] to DP[N−1] are input to the terminals 41<0> to 41<N−1>, respectively, and image signals DN[0] to DN[N−1] are input to the terminals 42<0> to 42<N−1>, respectively.

To the terminals 41 and 42, not only the image signals DP[0:N−1] and DN[0:N−1] but also command signals are input. The signal line driver circuit 100 is provided with, in addition to the terminals 40, 41, and 42, an input terminal for a power supply voltage, input terminals for various signals, output terminals for various signals, and the like.

The LVDS receiver 118 has a function of converting input differential signals into a single-ended signal. The LVDS receiver 118 converts the image signals DP[0:N−1] and DN[0:N−1] into a single-ended image signal DSE.

The logic circuit 119 has a function of controlling the circuits included in the signal line driver circuit 100 in accordance with a command signal or the like input from the outside. Specifically, the logic circuit 119 generates signals SSP, SCLK, LTS, and the like. The signals SSP and SCLK are control signals for the shift register 111. The signal LTS is a control signal for the latch circuit 112.

The logic circuit 119 has a function of converting a serial image signal DSE into a parallel image signal DOUT (serial-to-parallel conversion function).

The shift register 111 includes plural flip-flop (FF) circuits. The signal SSP (start pulse signal) is input to the first FF circuit, whereby a sampling signal is output from each FF circuit at predetermined timing. The timing at which each FF circuit outputs the sampling signal is controlled with the signal SCLK (clock signal).

The latch circuit 112 samples the image signal DOUT in accordance with the sampling signal and stores the image signal DOUT. The timing at which the latch circuit 112 outputs the stored image signal is controlled with the signal LTS.

The level shifter 113 has a function of boosting the image signal output from the latch circuit 112 and outputting it.

The D/A converter circuit 114 includes the semiconductor device 10 described in Embodiment 1. With such a structure, reduction in a circuit area and improvement in display quality can be achieved.

The amplifier circuit 115 has a function of amplifying the analog image signal output from the D/A converter circuit 114 and outputting it to the signal lines SL. Note that the amplifier circuit 115 is referred to as an output circuit in some cases.

Figure 14A:
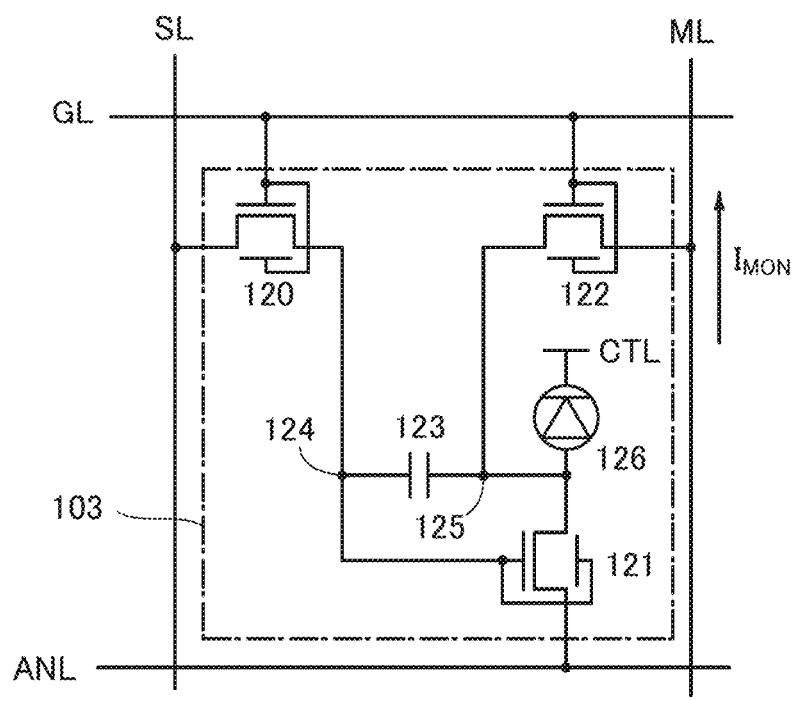
FIG. 14A is a circuit diagram illustrating a configuration example of a pixel.
Figure 14B:
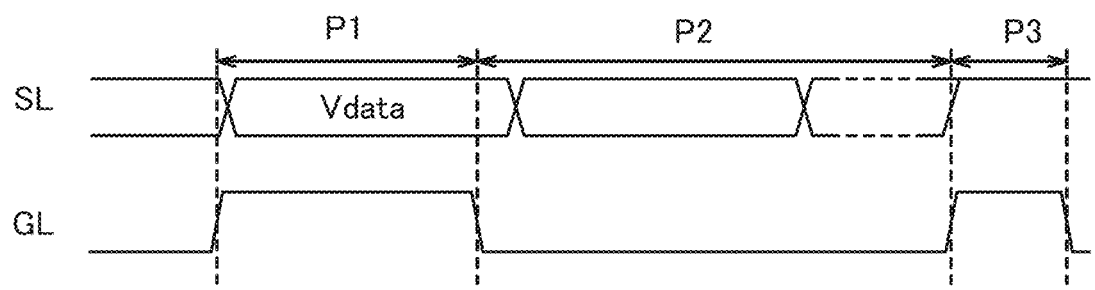
FIG. 14B is a timing chart illustrating an operation example of the pixel.

Next, a configuration example of a circuit that can be used for the pixel 103 is described.
<Example of Pixel Circuit for Display Panel Including Light-Emitting Element>
FIG. 14A illustrates an example of the pixel 103 that can be used for a panel including a light-emitting element. FIG. 14B is a timing chart showing an operation example of the pixel 103 illustrated in FIG. 14A.

The pixel 103 is electrically connected to the scan line GL, the signal line SL, a wiring ML, a wiring CTL, and a wiring ANL. The pixel 103 includes transistors 120 to 122, a capacitor 123, and a light-emitting element 126.

The light-emitting element 126 includes a pair of terminals (an anode and a cathode). As the light-emitting element 126, an element which can control the luminance with current or voltage can be used. As the light-emitting element 126, a light-emitting element utilizing electroluminescence (also referred to as an EL element) can be used. An EL element includes a light-emitting layer (also referred to as an EL layer) between a pair of electrodes.

Although the transistors 120 to 122 are n-channel transistors in FIG. 14A, one or more, or all of the transistors 120 to 122 may be p-channel transistors. The transistors 120 to 122 each include a back gate electrically connected to a gate. With such a device structure, the current drive capability of the transistors 120 to 122 can be improved. One or more, or all of the transistors 120 to 122 may be transistors without back gates.

The transistor 120 is a pass transistor which connects a gate of the transistor 121 (a node 124) and the signal line SL. The transistor 122 is a pass transistor which connects the wiring ML and an anode of the light-emitting element 126 (a node 125). The transistor 121 is a driving transistor and functions as a source of current supplied to the light-emitting element 126. In accordance with the amount of drain current of the transistor 121, the luminance of the light-emitting element 126 is adjusted. The capacitor 123 is a storage capacitor which stores voltage between the node 125 and the node 124.

Variation in the drive capability of the transistors 121 in the pixels 103 causes variation in the luminance of the light-emitting elements 126, which results in decrease in display quality. The pixels 103 in FIG. 14A have a function of correcting variation in the luminance of the light-emitting elements 126 by monitoring drain currents of the transistors 121.

FIG. 14B shows an example of a timing chart of a potential of the scan line GL illustrated in FIG. 14A and a potential of the image signal supplied to the signal line SL. Note that the timing chart of FIG. 14B is an example in which all the transistors included in the pixel 103 are n-channel transistors.

A period P1 is a writing operation period and the light-emitting element 126 does not emit light during the period. A high-level potential is supplied to the scan line GL, and the transistors 120 and 122 are turned on. A potential Vdata is supplied to the signal line SL as an image signal. The potential Vdata is supplied to the node 124 through the transistor 120.

In the case where the transistor 121 is an n-channel type, it is preferable that, in the period PI, the potential of the wiring ML be lower than the sum of the potential of the wiring CTL and the threshold voltage Vthe of the light-emitting element 126, and the potential of the wiring ANL be higher than the potential of the wiring ML. With the above configuration, the drain current of the transistor 121 can be made to flow preferentially through the wiring ML instead of the light-emitting element 126.

A period P2 is a light emission period and the light-emitting element 126 emits light during the period. A low-level potential is supplied to the scan line GL, and the transistors 120 and 122 are turned off. When the transistor 120 is turned off, the potential Vdata is held at the node 124. A potential Vano is supplied to the wiring ANL, and a potential Vcat is supplied to the wiring CTL. The potential Vano is preferably higher than the sum of the potential Vcat and the threshold voltage Vthe of the light-emitting element 126. The potential difference between the wiring ANL and the wiring CTL allows the drain current of the transistor 121 to flow into the light-emitting element 126; thus, the light-emitting element 126 emits light.

A period P3 is a monitor period in which the drain current of the transistor 121 is obtained. A high-level potential is supplied to the scan line GL, and the transistors 120 and 122 are turned on. In addition, such a potential that the gate voltage of the transistor 121 is higher than the threshold voltage Vth thereof is supplied to the signal line SL. The potential of the wiring ML is preferably lower than the sum of the potential of the wiring CTL and the threshold voltage Vthe of the light-emitting element 126. The potential of the wiring ANL is preferably higher than the potential of the wiring ML. With the above configuration, the drain current of the transistor 121 can be made to flow preferentially through the wiring ML instead of the light-emitting element 126.

A current IMON output from the pixel 103 to the wiring ML in the period P3 corresponds to the drain current flowing into the transistor 121 during the light emission period. The current IMON is supplied to a monitor circuit. The monitor circuit analyzes the current IMON and generates a correction signal on the basis of the analysis result. Through the operation, deviation of the luminance of the pixels 103 can be corrected.

The monitor operation is not necessarily performed after the light-emitting operation. For example, in the pixel 103, the monitor operation can be performed after the cycle of data writing operation and light-emitting operation is repeated plural times. Alternatively, after the monitor operation, the light-emitting element 126 may be brought into a non-light-emitting state by writing a data signal corresponding to the lowest grayscale level [0] to the pixel 103.

Figure 15A:
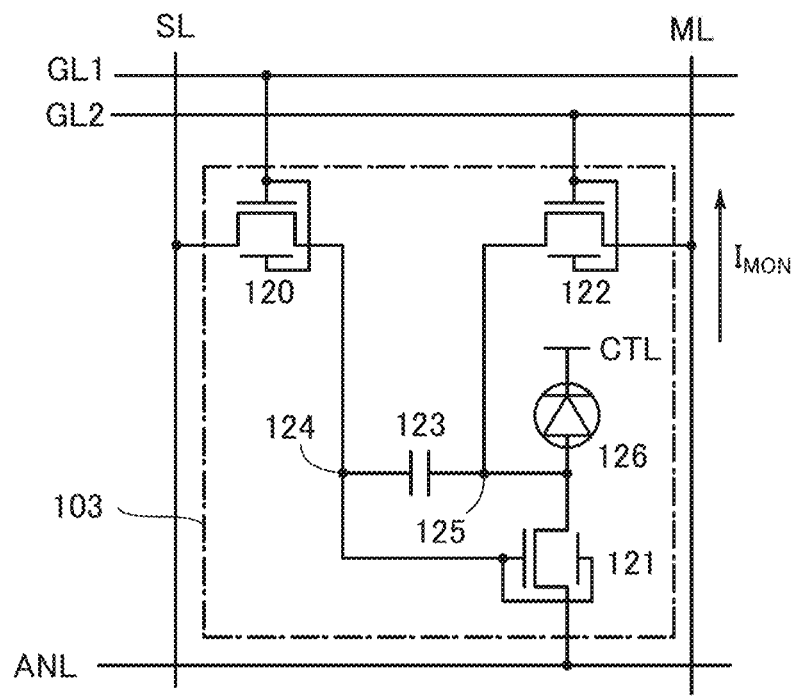
FIGS. 15A and 15B are circuit diagrams each illustrating a configuration example of a pixel.

The pixel 103 illustrated in FIG. 14A may be connected to a plurality of scan lines. A circuit diagram of such a case is illustrated in FIG. 15A. In the pixel 103 illustrated in FIG. 15A, the gate of the transistor 120 is electrically connected to a scan line GL1, and the gate of the transistor 122 is electrically connected to a scan line GL2. With such a structure, the transistors 120 and 122 can be individually turned on and off and the timing of the monitor operation can be controlled more freely.

Figure 15B:
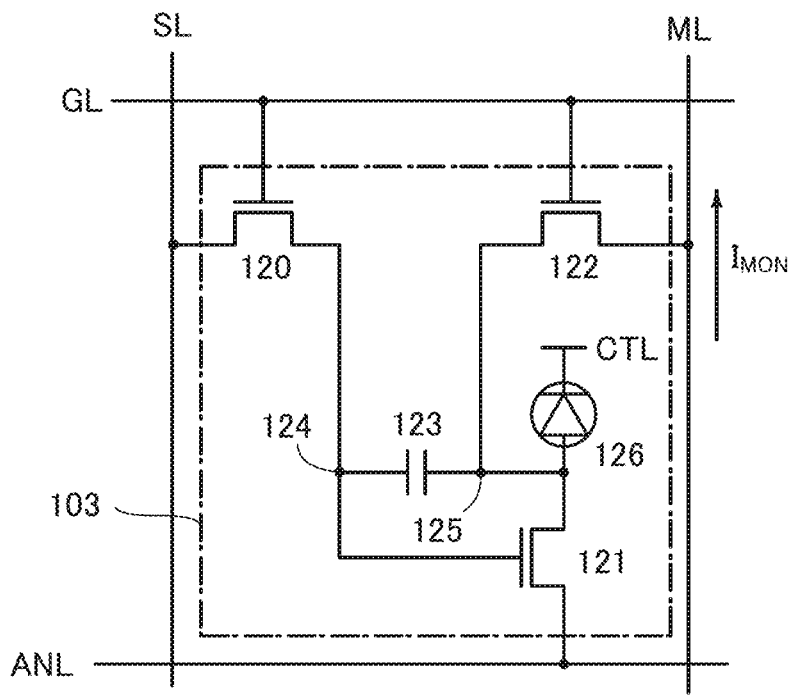

In the pixel 103 illustrated in FIG. 14A, the transistors 120 to 122 do not necessarily include back gates. FIG. 15B illustrates a circuit diagram of that case. The structure illustrated in FIG. 15B can facilitate the manufacturing process of the pixel 103.

<Example of Pixel Circuit for Panel Including Liquid Crystal Element>

Figure 16A:
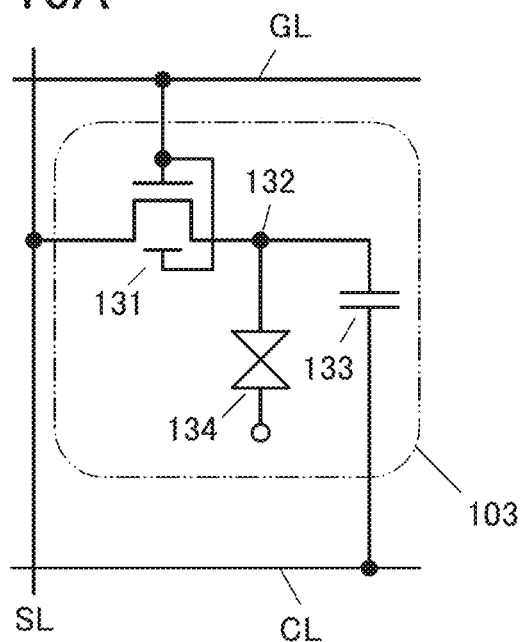
FIGS. 16A and 16B are circuit diagrams each illustrating a configuration example of a pixel.

FIG. 16A illustrates an example of a pixel circuit that can be used for a panel including a liquid crystal element. The pixel 103 illustrated in FIG. 16A includes a transistor 131, a capacitor 133, and a liquid crystal element 134 functioning as a display element.

A gate of the transistor 131 is electrically connected to the scan line GL. A first terminal of the transistor 131 is electrically connected to the signal line SL. A second terminal of the transistor 131 is electrically connected to a first terminal of the capacitor 133 and a first terminal of the liquid crystal element 134. A node of the second terminal of the transistor 131, the first terminal of the capacitor 133, and the first terminal of the liquid crystal element 134 is referred to as a node 132. The transistor 131 has a function of controlling whether to write a data signal to the node 132.

A second terminal of the capacitor 133 is electrically connected to a wiring (also referred to as a capacitor line CL) to which a particular potential is supplied. The potential of the capacitor line CL is set in accordance with the specifications of the pixel 103 as appropriate. The capacitor 133 functions as a storage capacitor for storing data written to the node 132.

The potential of a second terminal of the liquid crystal element 134 is set in accordance with the specifications of the pixel 103 as appropriate. The alignment state of a liquid crystal in the liquid crystal element 134 depends on data written to the node 132. A common potential may be supplied to the second terminal of the liquid crystal element 134 included in each of the pixels 103.

As examples of a mode of the liquid crystal element 134, any of the following modes can be given: a twisted nematic (TN) mode, a super twisted nematic (STN) mode, a vertical alignment (VA) mode, an axially symmetric aligned microcell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, and a transverse bend alignment (TBA) mode. Other examples of the mode include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various modes can be employed.

Here, an operation example of the display panel including the pixel 103 illustrated in FIG. 16A is described. The pixels 103 are sequentially selected row by row by the scan line driver circuit 101, whereby the transistor 131 is turned on and a data signal is written to the node 132.

Then, the transistor 131 is turned off and the data signal written to the node 132 is stored. The amount of light transmitted through the liquid crystal element 134 is determined in accordance with the data signal written to the node 132. This operation is sequentially performed row by row; thus, an image can be displayed on the display region.

Figure 16B:
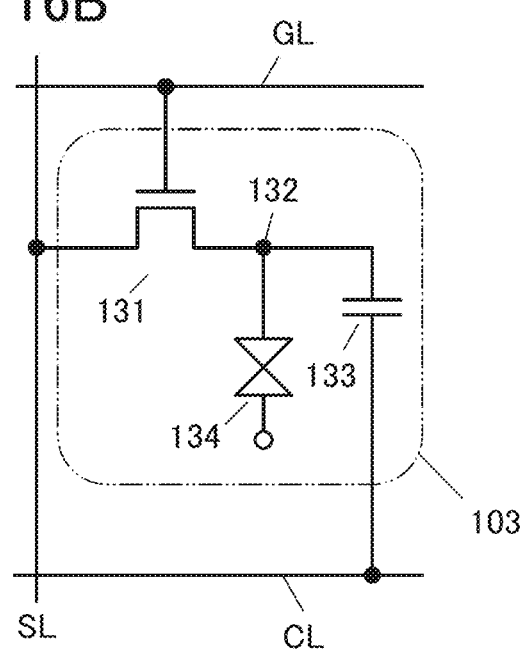

In the pixel 103 illustrated in FIG. 16A, the transistor 131 does not necessarily include a back gate. FIG. 16B illustrates a circuit diagram of that case. The structure illustrated in FIG. 16B can facilitate the manufacturing process of the pixel 103.

Embodiment 3

In this embodiment, a more specific structure example of the display panel described in the above embodiments is described with reference to FIGS. 17A to 17C, FIGS. 18A to 18C, FIGS. 19A and 19B, FIGS. 20A and 20B, and FIGS. 21A and 21B. In this embodiment, a display panel including a liquid crystal element and a display panel including a light-emitting element are described as examples of the display panel.

<Top View of Structure Example of Display Panel>

Figure 17A:
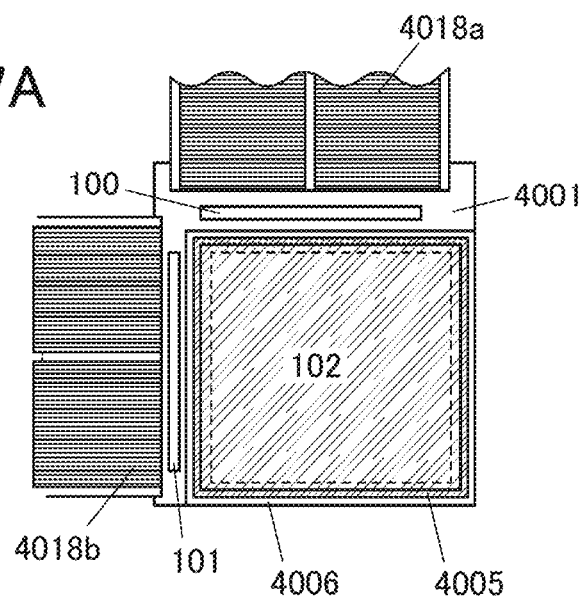
FIGS. 17A to 17C are top views each illustrating a structure example of a display panel.
Figure 17B:
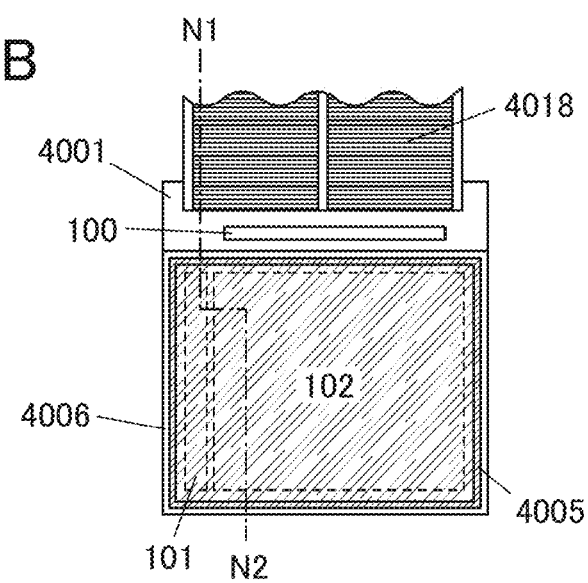
Figure 17C:
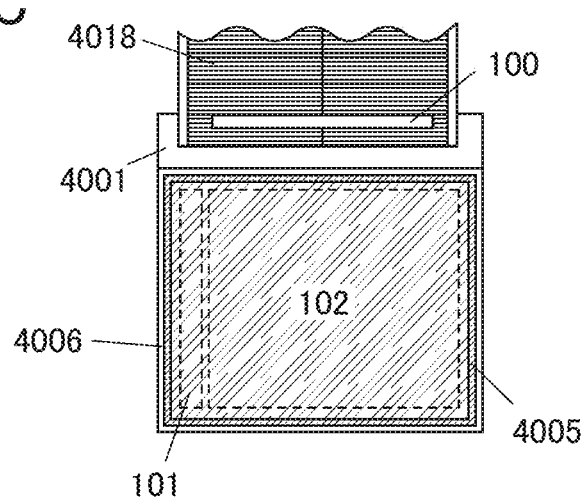

FIGS. 17A to 17C are top views each illustrating a structure example of a display panel.

In FIG. 17A, a sealant 4005 is provided so as to surround the pixel portion 102 provided over a first substrate 4001, and the pixel portion 102 is sealed by the sealant 4005 and a second substrate 4006. In FIG. 17A, the signal line driver circuit 100 and the scan line driver circuit 101 are each formed using a single crystal semiconductor or a polycrystalline semiconductor over a substrate separately prepared and mounted in a region different from the region surrounded by the sealant 4005 over the first substrate 4001.

Various signals and potentials are supplied to the signal line driver circuit 100, the scan line driver circuit 101, and the pixel portion 102 from flexible printed circuits (FPCs) 4018a and 4018b.

In FIGS. 17B and 17C, the sealant 4005 is provided so as to surround the pixel portion 102 and the scan line driver circuit 101 which are provided over the first substrate 4001. The second substrate 4006 is provided over the pixel portion 102 and the scan line driver circuit 101. Consequently, the pixel portion 102 and the scan line driver circuit 101 are sealed together with a display element by the first substrate 4001, the sealant 4005, and the second substrate 4006. In FIGS. 17B and 17C, the signal line driver circuit 100 formed using a single crystal semiconductor or a polycrystalline semiconductor over a substrate separately prepared is mounted in a region different from the region surrounded by the sealant 4005 over the first substrate 4001. In FIGS. 17B and 17C, various signals and potentials are supplied to the signal line driver circuit 100, the scan line driver circuit 101, and the pixel portion 102 from an FPC 4018.

In FIGS. 17B and 17C, examples in which a circuit formed through a process different from that of the pixel portion 102, such as an IC, is provided as the signal line driver circuit 100 over the first substrate 4001 are illustrated; however, the structure is not limited to these examples. The scan line driver circuit 101 may be formed using an IC or the like, or only part of the signal line driver circuit 100 or only part of the scan line driver circuit 101 may be formed using an IC or the like.

The connection method of a driver circuit formed using an IC or the like is not particularly limited: wire bonding, chip on glass (COG), tape carrier package (TCP), chip on film (COF), or the like can be used. FIG. 17A illustrates an example in which the signal line driver circuit 100 and the scan line driver circuit 101 are mounted by COG. FIG. 17B illustrates an example in which the signal line driver circuit 100 is mounted by COG. FIG. 17C illustrates an example in which the signal line driver circuit 100 is mounted by TCP.

Figure 18A:
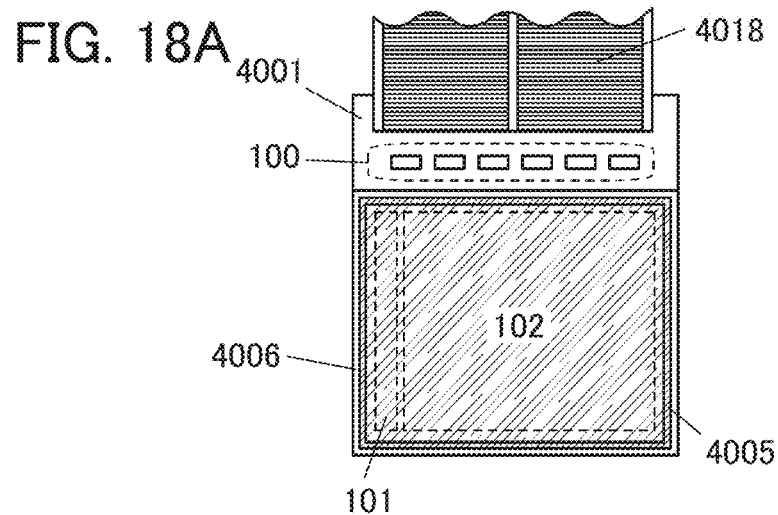
FIGS. 18A to 18C are top views each illustrating a structure example of a display panel.

In the case where the signal line driver circuit 100 is formed using an IC, the number of ICs is not limited to one and the signal line driver circuit 100 may include a plurality of ICs. Similarly, in the case where the scan line driver circuit 101 is formed using an IC, the number of ICs is not limited to one and the scan line driver circuit 101 may include a plurality of ICs. FIG. 18A illustrates an example in which six ICs are used for the signal line driver circuit 100. The signal line driver circuit including a plurality of ICs can achieve higher definition of the pixel portion 102.

Figure 18B:
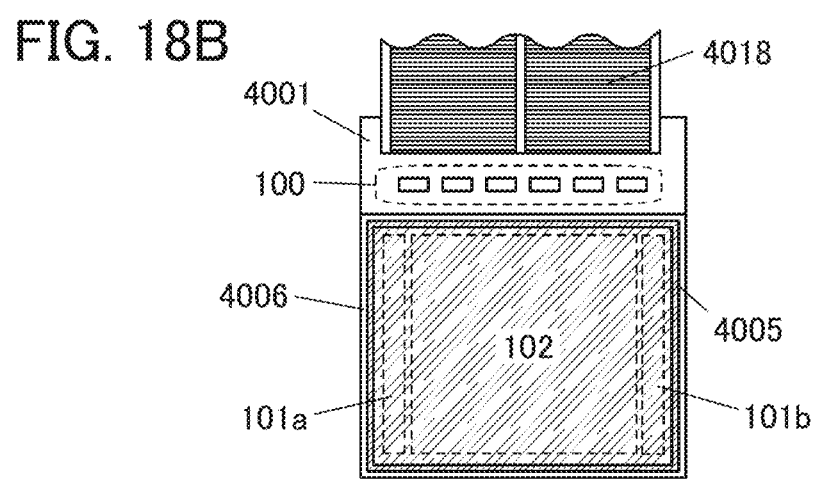

The scan line driver circuit 101 may be provided in both the left and right sides of the pixel portion 102. FIG. 18B illustrates a structure example of the case where a scan line driver circuit 101a and a scan line driver circuit 101b are provided in the left and right sides of the pixel portion 102.

Figure 18C:
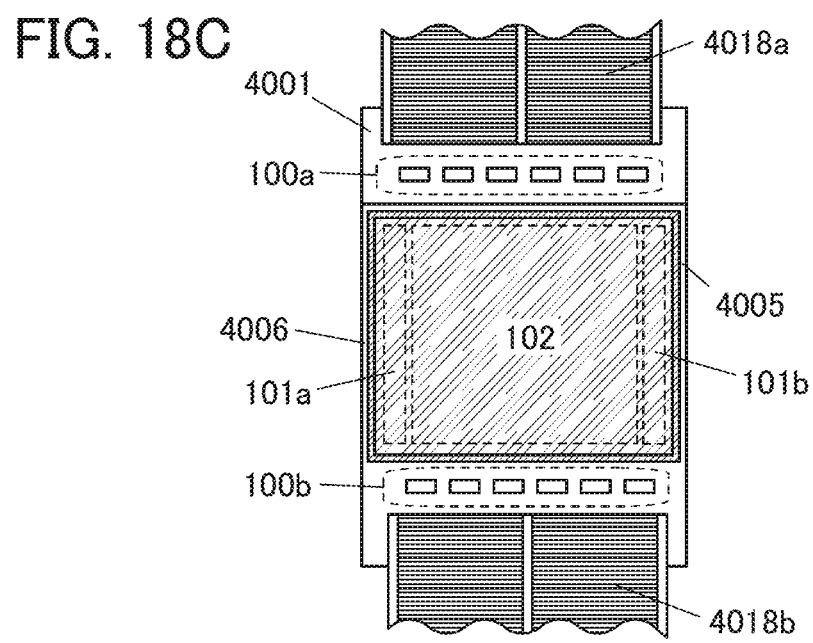

The signal line driver circuit 100 may be provided along both the top and bottom sides of the pixel portion 102. FIG. 18C illustrates a structure example of the case where a signal line driver circuit 100a and a signal line driver circuit 100b are provided along the top and bottom sides of the pixel portion 102. Each of the signal line driver circuits includes six ICs.

<Cross-Sectional View of Structure Example of Display Panel>

Figure 19A:
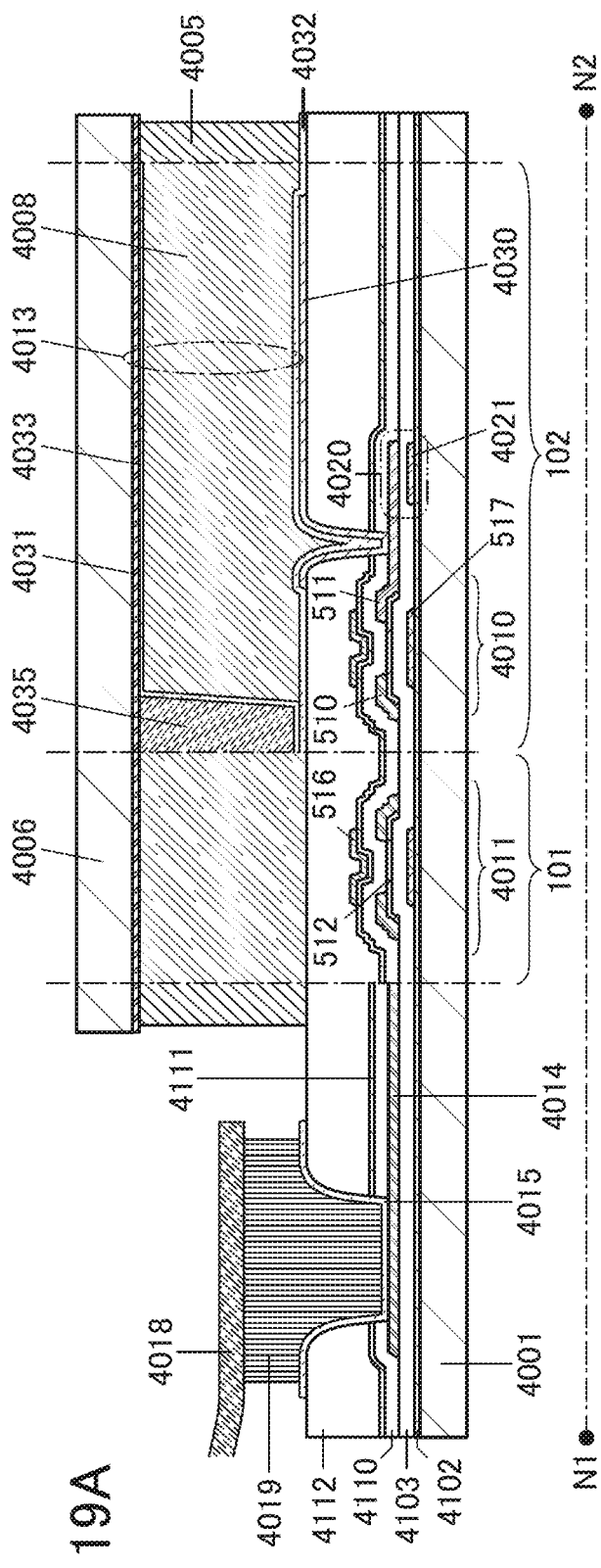
FIGS. 19A and 19B are cross-sectional views each illustrating a structure example of a display panel.
Figure 19B:
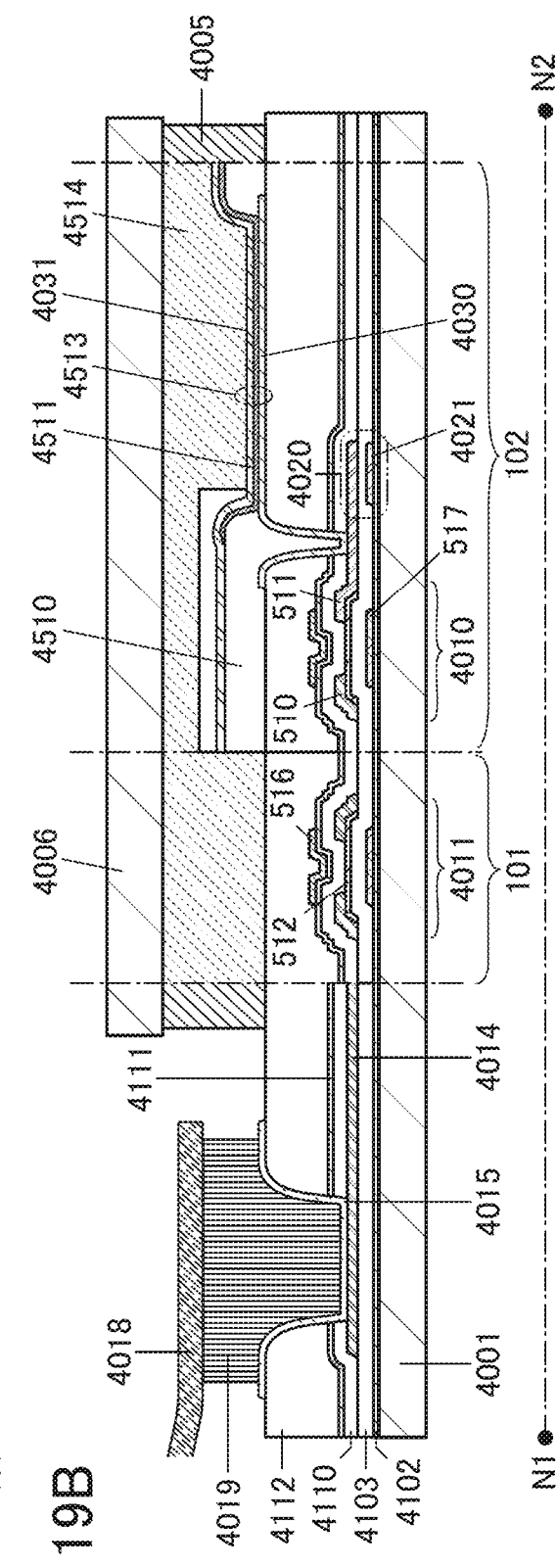

FIGS. 19A and 19B correspond to cross-sectional views taken along chain line N1-N2 in FIG. 17B.

As shown in FIGS. 19A and 19B, the display panel has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110. The electrode 4015 is formed of the same conductive layer as a first electrode layer 4030.

The pixel portion 102 and the scan line driver circuit 101 provided over the first substrate 4001 each include a plurality of transistors. In each of FIGS. 19A and 19B, a transistor 4010 included in the pixel portion 102 and a transistor 4011 included in the scan line driver circuit 101 are illustrated. The insulating layer 4112 is provided over the transistors 4010 and 4011 in FIG. 19A, and a bank 4510 is further provided over the insulating layer 4112 in FIG. 19B.

The transistors 4010 and 4011 are provided over an insulating layer 4102. The transistors 4010 and 4011 include electrodes 517 over the insulating layer 4102. An insulating layer 4103 is formed over the electrodes 517. Semiconductor layers 512 are formed over the insulating layer 4103. Electrodes 510 and electrodes 511 are formed over the semiconductor layers 512. The insulating layer 4110 and the insulating layer 4111 are formed over the electrodes 510 and the electrodes 511. Electrodes 516 are formed over the insulating layer 4110 and the insulating layer 4111. The electrodes 510 and the electrodes 511 are formed of the same conductive layer as the wiring 4014.

In each of the transistors 4010 and 4011, the electrode 517 functions as a gate electrode, the electrode 510 functions as one of a source electrode and a drain electrode, the electrode 511 functions as the other of the source electrode and the drain electrode, and the electrode 516 functions as a back gate electrode.

Since the transistors 4010 and 4011 each include a bottom gate and a back gate, the on-state current of the transistors can be increased. Moreover, the threshold voltage of the transistors can be controlled.

In each of the transistors 4010 and 4011, the semiconductor layer 512 functions as a channel formation region. For the semiconductor layer 512, crystalline silicon, polycrystalline silicon, amorphous silicon, an oxide semiconductor, an organic semiconductor, or the like may be used. Impurities may be introduced to the semiconductor layer 512, if necessary, to increase conductivity of the semiconductor layer 512 or control the threshold voltage of the transistor.

In the case where an oxide semiconductor is used for the semiconductor layer 512, the semiconductor layer 512 preferably includes indium (In). When an oxide semiconductor containing indium is used for the semiconductor layer 512, the carrier mobility (electron mobility) of the semiconductor layer 512 can be high. The semiconductor layer 512 is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The semiconductor layer 512 is preferably an oxide semiconductor containing zinc (Zn). When the oxide semiconductor contains zinc, the oxide semiconductor is easily crystallized in some cases.

The semiconductor layer 512 is not limited to the oxide semiconductor containing indium. The oxide semiconductor layer 512 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

The display panels illustrated in FIGS. 19A and 19B each include a capacitor 4020. The capacitor 4020 has a region in which the electrode 511 overlaps with an electrode 4021 with the insulating layer 4103 therebetween. The electrode 4021 is formed of the same conductive layer as the electrodes 517.

An example of a liquid crystal display panel using a liquid crystal element as a display element is illustrated in FIG. 19A. In FIG. 19A, a liquid crystal element 4013 which is a display element includes the first electrode layer 4030, a second electrode layer 4031, and a liquid crystal layer 4008. Insulating layers 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is not involved may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral material at 5 wt % or more is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. In addition, since an alignment film does not need to be provided and rubbing treatment is unnecessary, electrostatic discharge caused by the rubbing treatment can be prevented and defects and damage of the liquid crystal display panel can be reduced in the manufacturing process. Thus, the productivity of the liquid crystal display panel can be increased.

Moreover, it is possible to use a method called domain multiplication or multi-domain design, in which a pixel is divided into some regions (subpixels) and molecules are aligned in different directions in their respective regions.

The specific resistivity of the liquid crystal material is higher than or equal to $1 \times 10^9$ Ω·cm, preferably higher than or equal to $1 \times 10^{11}$ Ω·cm, further preferably higher than or equal to 1×10$^{12}$ Ω·cm. Note that the specific resistivity in this specification is measured at 20° C.

In the case where the transistor 4010 is an oxide semiconductor transistor, the transistor 4010 can have a small current in an off-state (off-state current). Accordingly, an electric signal such as an image signal can be held for a longer period, and a writing interval can be set longer in an on state. Accordingly, the frequency of refresh operation can be reduced, which leads to an effect of suppressing power consumption.

In the display panel, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

FIG. 19B illustrates an example of a display panel including, as a display element, a light-emitting element such as an EL element. EL elements are classified into organic EL elements (or organic light-emitting diodes (OLEDs)) and inorganic EL elements.

In the organic EL element, by voltage application, electrons are injected from one electrode to an EL layer and holes are injected from the other electrode to the EL layer. The carriers (electrons and holes) are recombined, and thus, a light-emitting organic compound is excited. The light-emitting organic compound returns to a ground state from the excited state, thereby emitting light. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

FIG. 19B illustrates an example in which an organic EL element is used as a light-emitting element 4513.

In FIG. 19B, the light-emitting element 4513 is electrically connected to the transistor 4010 in the pixel portion 102. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and the sealant 4005, a filler 4514 is provided for sealing. It is preferable that, in this manner, the light-emitting element be packaged (sealed) with a protective film (such as a laminate film or an ultraviolet curable resin film) or a cover member with high air-tightness and little degasification so that the light-emitting element is not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer 4030 and the second electrode layer 4031 each can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

Alternatively, a conductive composition containing a conductive high molecule (also called a conductive polymer) can be used for the first electrode layer 4030 and the second electrode layer 4031. As the conductive high molecule, a so-called n-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

In order to extract light emitted from the light-emitting element 4513 to the outside, at least one of the first electrode layer 4030 and the second electrode layer 4031 is transparent. In accordance with how to extract light, the structures of the display panels are classified into a top emission structure, a bottom emission structure, and a dual emission structure. In the top emission structure, light is extracted through the substrate 4006. In the bottom emission structure, light is extracted through the substrate 4001. In the dual emission structure, light is extracted through both the substrate 4006 and the substrate 4001. For example, the second electrode layer 4031 is transparent in the case of the top emission structure. The first electrode layer 4030 is transparent in the case of the bottom emission structure. The first and second electrode layers 4030 and 4031 are transparent in the case of the dual emission structure.

FIG. 20A is a cross-sectional view in which top-gate transistors are provided as the transistors 4011 and 4010 in FIG. 19A. Similarly, FIG. 20B is a cross-sectional view in which top-gate transistors are provided as the transistors 4011 and 4010 in FIG. 19B.

In each of the transistors 4010 and 4011 in each of FIGS. 20A and 20B, the electrode 517 functions as a gate electrode, the electrode 510 functions as one of a source electrode and a drain electrode, and the electrode 511 functions as the other of the source electrode and the drain electrode.

The description of FIGS. 19A and 19B can be referred to for the detail of other components in FIGS. 20A and 20B.

FIG. 21A is a cross-sectional view in which the transistors 4010 and 4011 in FIG. 20A each include an electrode 516 functioning as a back gate. Similarly, FIG. 21B is a cross-sectional view in which the transistors 4010 and 4011 in FIG. 20B each include the electrode 516 functioning as a back gate.

The transistors 4010 and 4011 each include a top gate and a back gate, so that the on-state current of the transistors can be increased. In addition, the threshold voltage of the transistors can be controlled.

The description of FIGS. 19A and 19B can be referred to for the detail of other components in FIGS. 21A and 21B.

Embodiment 4

An application example of a display module including the display panel described in the above embodiments is described with reference to FIG. 22.

Figure 22:
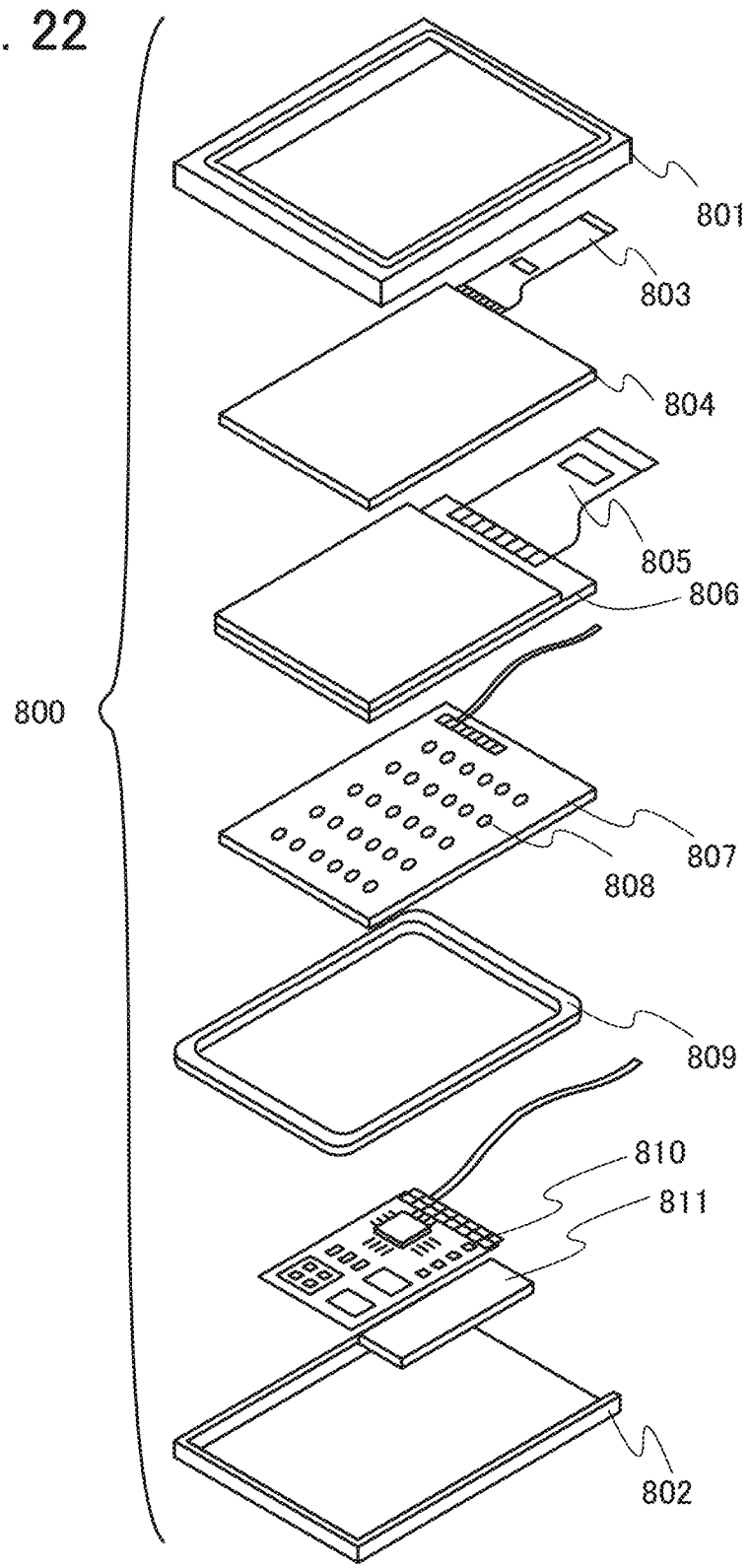
FIG. 22 illustrates an example of a display module.

In a display module 800 illustrated in FIG. 22, a touch panel 804 connected to an FPC 803, a display panel 806 connected to an FPC 805, a backlight unit 807, a frame 809, a printed circuit board 810, and a battery 811 are provided between an upper cover 801 and a lower cover 802. Note that the backlight unit 807, the battery 811, the touch panel 804, and the like are not provided in some cases.

The display panel described in the above embodiments can be used as the display panel 806 in FIG. 22.

The shapes and sizes of the upper cover 801 and the lower cover 802 can be changed as appropriate in accordance with the sizes of the touch panel 804 and the display panel 806.

The touch panel 804 can be a resistive touch panel or a capacitive touch panel and can be formed to overlap with the display panel 806. It is also possible to provide a touch panel function for a counter substrate (sealing substrate) of the display panel 806. Alternatively, a photosensor may be provided in each pixel of the display panel 806 so that an optical touch panel is obtained. Further alternatively, an electrode for a touch sensor may be provided in each pixel of the display panel 806 so that a capacitive touch panel is obtained. In such cases, the touch panel 804 can be omitted.

Figure 23A:
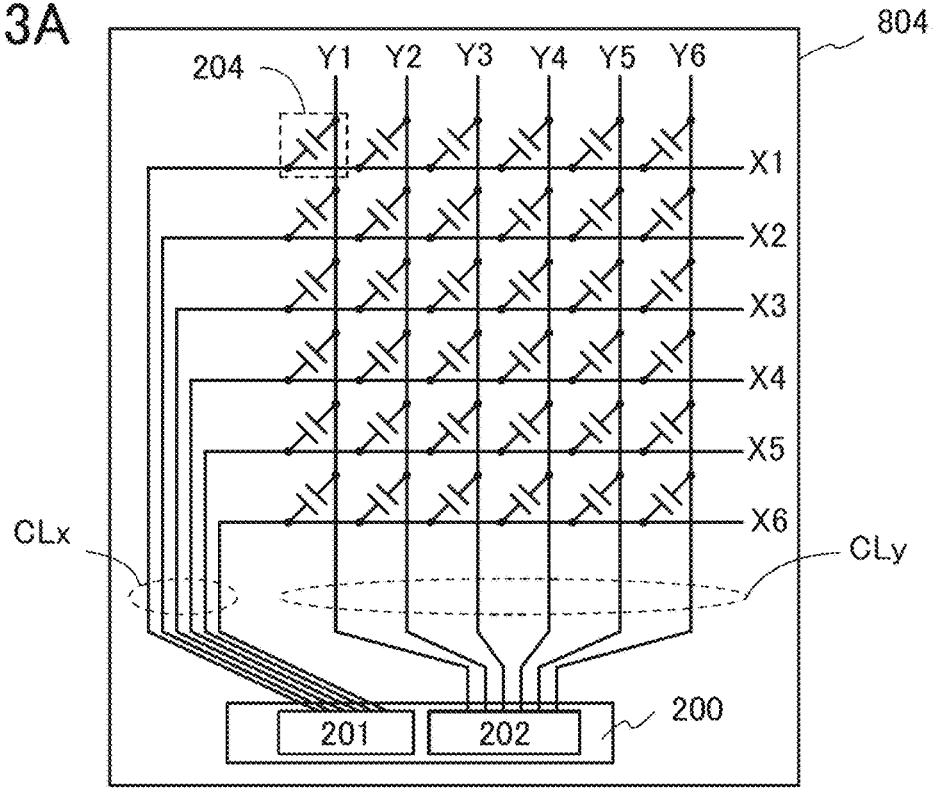
FIGS. 23A and 23B are schematic views each illustrating a structure example of a touch panel.

FIG. 23A is a schematic diagram illustrating a structure example where the touch panel 804 is a mutual capacitive touch sensor. In FIG. 23A, as an example, six wirings X1 to X6 represent wirings CLx to which a pulse voltage is applied, and six wirings Y1 to Y6 represent wirings CLy which detect changes in current. The number of wirings is not limited to those illustrated in FIG. 23A. FIG. 23A also illustrates a capacitor 204 that is formed with the wiring CLx and the wiring CLy overlapping with each other or being provided close to each other.

The wirings CLx and the wirings CLy are electrically connected to an IC 200. The IC 200 includes a driver circuit 201 and a detecting circuit 202.

The driver circuit 201 is, for example, a circuit for sequentially applying a pulse voltage to the wirings X1 to X6. By applying a pulse voltage to the wirings X1 to X6, an electric field is generated between the wirings CLx and CLy of the capacitors 204. With a pulse voltage, current flows through the capacitor 204. An electric field generated between the wirings is changed by being blocked, for example, when a finger or a stylus touches the touch sensor. That is, for example, by touch with a finger or a stylus, the capacitance of the capacitor 204 is changed. By utilizing the change in capacitance caused by touch with a finger or a stylus as described above, the approach or contact of an object can be detected.

The detecting circuit 202 is a circuit for detecting changes in current flowing through the wirings Y1 to Y6 that are caused by the changes in capacitance of the capacitors 204. No change in the current values of the wirings Y1 to Y6 is detected when there is no approach or contact of an object, whereas a decrease in the current value is detected when capacitance is decreased owing to the approach or contact of an object. In order to detect a change in current, the total amount of current may be detected. In that case, an integrator circuit or the like may be used to detect the total amount of current. Alternatively, the peak value of current may be detected. In that case, current may be converted into voltage, and the peak value of voltage may be detected.

Although the driver circuit 201 and the detecting circuit 202 are formed in the same IC in FIG. 23A, the driver circuit 201 and the detecting circuit 202 may be formed in separate ICs. The detecting circuit 202 easily malfunctions due to the influence of noise, while the driver circuit 201 might be a generation source of noise. The detecting circuit 202 can be prevented from malfunctioning by being formed in an IC different from an IC in which the driver circuit 201 is formed.

The driver circuit 201, the detecting circuit 202, and a driver circuit of the display panel 806 may be formed in one IC, which results in reduction in proportion of cost of an IC in the cost of the whole display module.

Figure 23B:
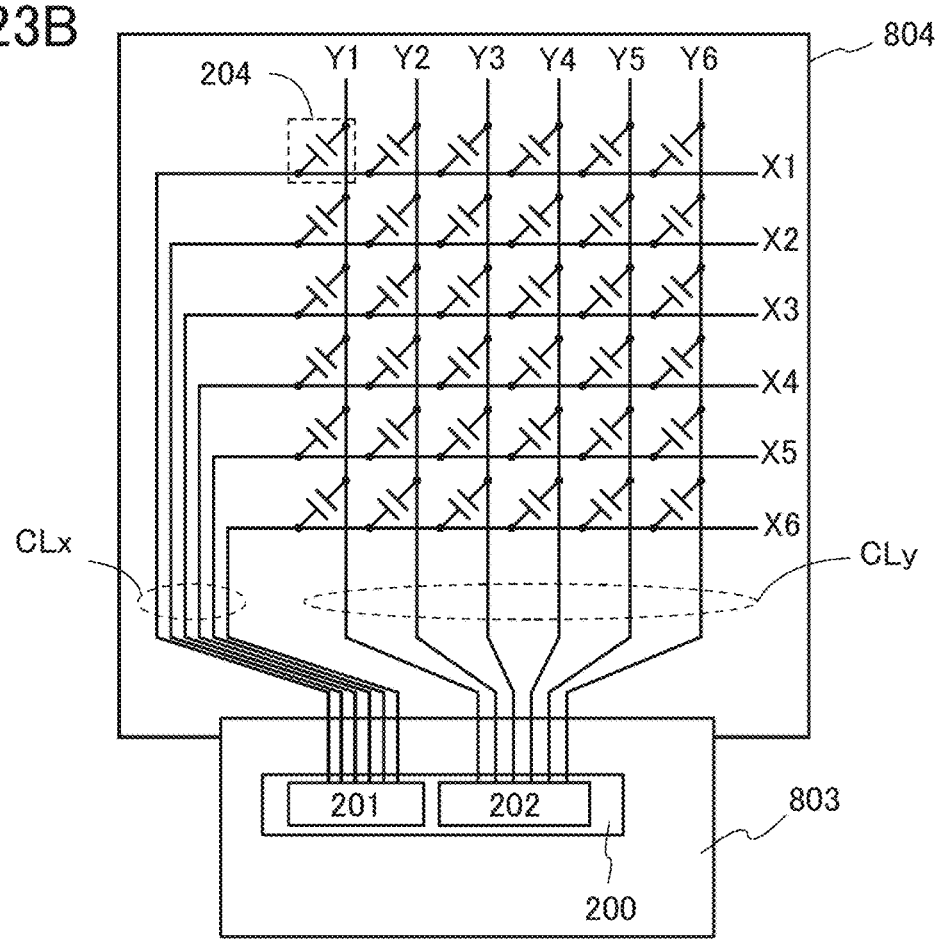

The IC 200 is provided in the touch panel 804 in FIG. 23A; however, the IC 200 may be provided in the FPC 803. FIG. 23B is a schematic view illustrating the case.

Description is continued with reference to FIG. 22.

The backlight unit 807 includes a light source 808. The light source 808 may be provided at an end portion of the backlight unit 807 and a light diffusing plate may be used.

The frame 809 protects the display panel 806 and functions as an electromagnetic shield for blocking electromagnetic waves generated by the operation of the printed circuit board 810. The frame 809 may also function as a radiator plate.

The printed circuit board 810 is provided with a power supply circuit and a signal processing circuit for outputting a video signal and a clock signal. As a power source for supplying power to the power supply circuit, an external commercial power source or a separate power source using the battery 811 may be used. The battery 811 can be omitted in the case of using a commercial power source.

The display module 800 may be additionally provided with a polarizing plate, a retardation plate, a prism sheet, or the like.

Embodiment 5

In this embodiment, examples of electronic devices including the display panel described in the above embodiments are described with reference to FIGS. 24A to 24F.

Examples of electronic devices which include the above-described display panel in a display portion are television devices (also referred to as TV or television receivers), monitors for computers and the like, cameras such as digital cameras and digital video cameras, digital photo frames, cellular phones (also referred to as cell phones or portable telephone devices), portable game machines, portable information terminals, audio playback devices, large game machines such as pachinko machines, and the like. When having flexibility, the above-described electronic device can be incorporated along a curved inside/outside wall surface of a house or a building or a curved interior/exterior surface of a car. FIGS. 24A to 24F illustrate structure examples of the electronic devices.

Figure 24A:
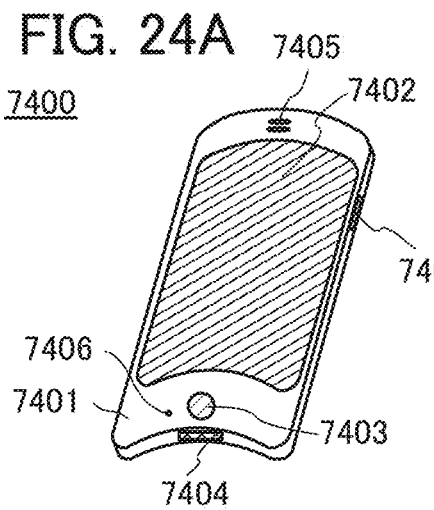
FIGS. 24A to 24F illustrate examples of electronic devices.

A cellular phone 7400 illustrated in FIG. 24A is provided with a display portion 7402 incorporated in a housing 7401, operation buttons 7403, an external connection port 7404, a speaker 7405, a microphone 7406, and the like. When the display portion 7402 of the cellular phone 7400 is touched with a finger or the like, data can be input to the cellular phone 7400. Furthermore, operations such as making a call and inputting a character can be performed by touch on the display portion 7402 with a finger or the like. The power can be turned on or off with the operation button 7403. In addition, types of images displayed on the display portion 7402 can be switched; for example, switching images from a mail creation screen to a main menu screen is performed with the operation button 7403.

Figure 24B:
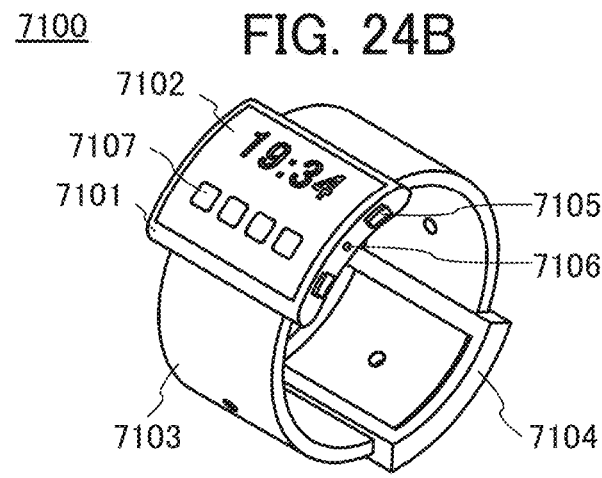

FIG. 24B illustrates an example of a watch-type portable information terminal. A portable information terminal 7100 illustrated in FIG. 24B includes a housing 7101, a display portion 7102, a band 7103, a buckle 7104, an operation button 7105, an input/output terminal 7106, and the like. The portable information terminal 7100 is capable of executing a variety of applications such as mobile phone calls, e-mailing, text viewing and editing, music reproduction, Internet communication, and computer games. The display surface of the display portion 7102 is bent, and images can be displayed on the bent display surface. Furthermore, the display portion 7102 includes a touch sensor, and operation can be performed by touching the screen with a finger, a stylus, or the like. For example, an application can be started by touching an icon 7107 displayed on the display portion 7102.

With the operation button 7105, a variety of functions such as time setting, ON/OFF of the power, ON/OFF of wireless communication, setting and cancellation of a silent mode, and setting and cancellation of a power saving mode can be performed. For example, the functions of the operation button 7105 can be set by setting the operating system incorporated in the portable information terminal 7100. The portable information terminal 7100 can employ near field communication that is a communication method based on an existing communication standard. In that case, for example, mutual communication between the portable information terminal 7100 and a headset capable of wireless communication can be performed, and thus hands-free calling is possible. Moreover, the portable information terminal 7100 includes the input/output terminal 7106, and data can be directly transmitted to and received from another information terminal via a connector. Power charging through the input/output terminal 7106 is possible. Note that the charging operation may be performed by wireless power feeding without using the input/output terminal 7106.

Figure 24C:
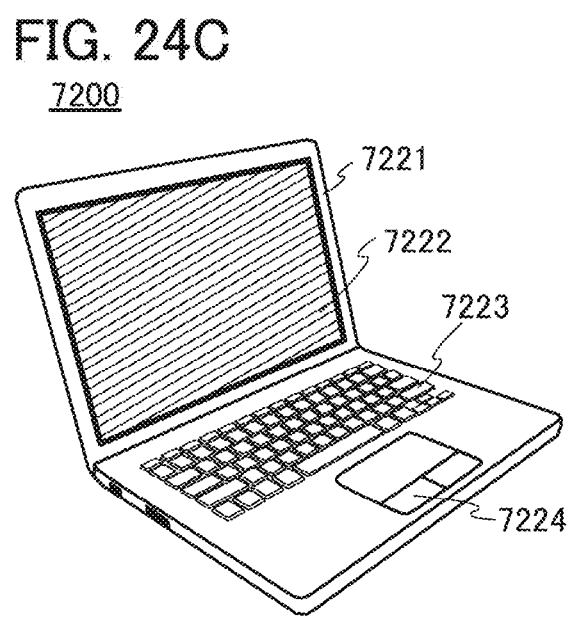

FIG. 24C illustrates a notebook personal computer (PC). A PC 7200 illustrated in FIG. 24C includes a housing 7221, a display portion 7222, a keyboard 7223, a pointing device 7224, and the like.

Figure 24D:
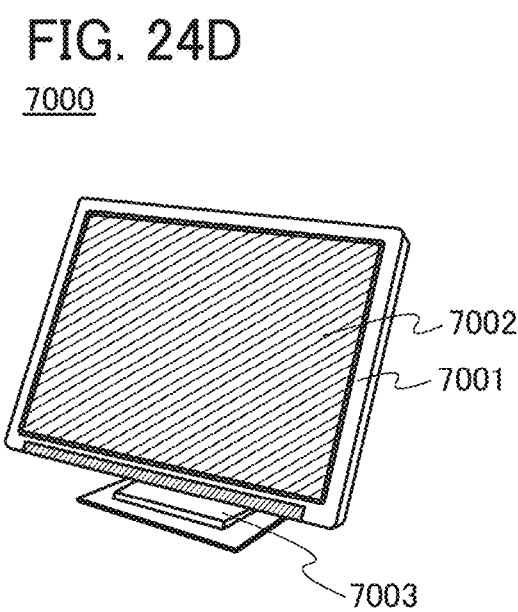

FIG. 24D illustrates a stationary display device. A display device 7000 illustrated in FIG. 24D includes a housing 7001, a display portion 7002, a supporting base 7003, and the like.

Figure 24E:
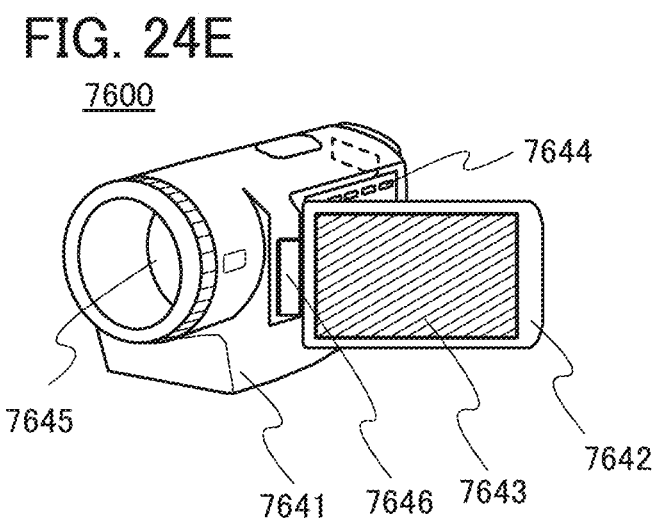

FIG. 24E illustrates a video camera 7600, which includes a first housing 7641, a second housing 7642, a display portion 7643, operation keys 7644, a lens 7645, a joint 7646, and the like.

Figure 24F:
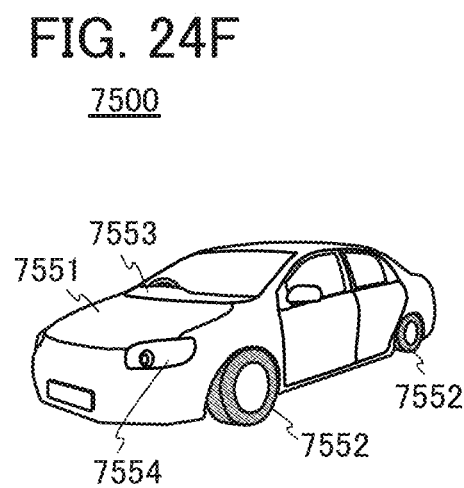

FIG. 24F illustrates a passenger car 7500, which includes a car body 7551, wheels 7552, a dashboard 7553, lights 7554, and the like.

The electronic devices each including the semiconductor device 10 described in Embodiment 1 can each have a display portion with excellent display quality.

In this specification and the like, ordinal numbers such as "first". "second", and "third" are used in order to avoid confusion among components. Thus, the terms do not limit the number or order of components. In this specification and the like, a "first" component in one embodiment can be referred to as a "second" component in other embodiments or claims. Furthermore, in this specification and the like, a "first" component in one embodiment can be referred to without the ordinal number in other embodiments or claims.

In this specification and the like, the terms "one of a source and a drain" (or first electrode or first terminal) and "the other of the source and the drain" (or second electrode or second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path. Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, and a layer).

Examples of the case where X and Y are directly connected include the case where an element that enables electrical connection between X and Y (e.g., a switch, a transistor, a capacitor, an inductor, a resistor, a diode, a display element, a light-emitting element, and a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, and a buffer circuit; a signal generator circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) 22, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Example 1

In this example, operation of the semiconductor device 10 described in Embodiment 1 was examined by Monte Carlo simulation.

FIG. 25 shows the differential non-linearity (DNL) analysis result of DEC[3:0](0000b to 1000b) at $V_{LO}$=1 V, 3.875 V, and 6.75 V.

According to the result in FIG. 25, the voltage $V_O$ monotonically increases when $V_{LO}$ ranges from 1 V to 6.75 V because DNL is higher than −1 least significant bit (LSB).

Figure 26:
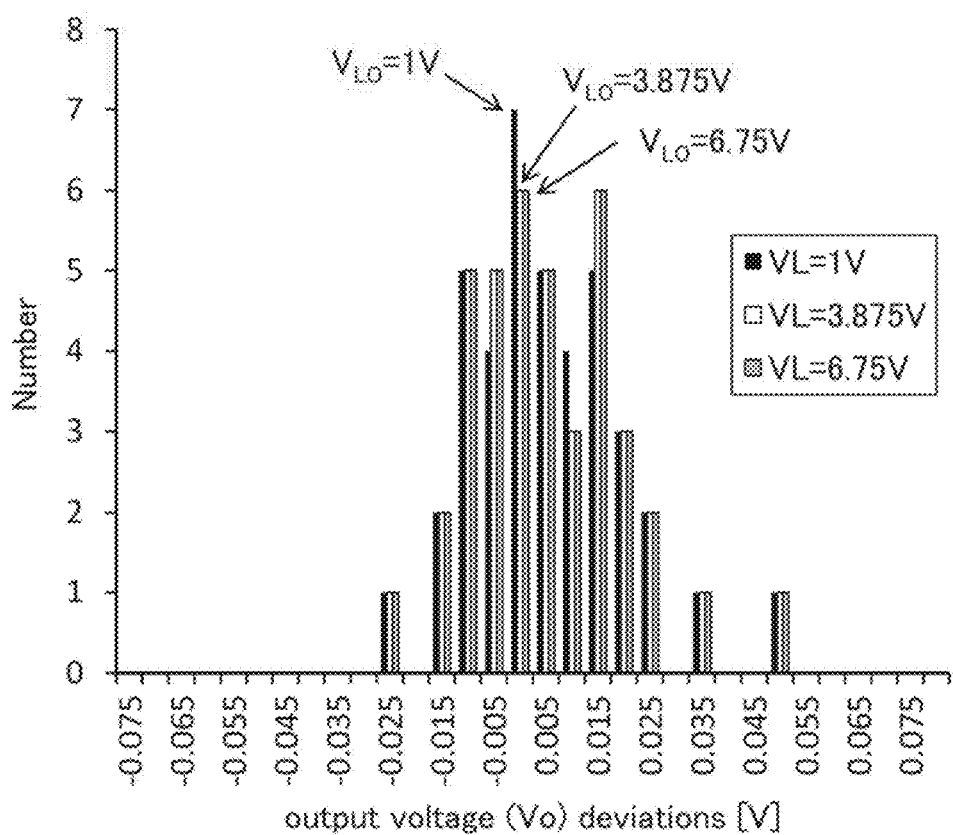
FIG. 26 shows a calculation result of voltage $V_O$ variation by Monte Carlo simulation.

In FIG. 26, analysis results of variation in the voltage $V_O$ are shown. The variation width is 74 mV. This variation is caused by the offset voltage ($\Delta V_{th2}$) variation of the amplifier circuit 15. The offset voltage variation of the amplifier circuit 15 can be measured by IC shipment test. The value is stored in external memory and subtraction of the offset voltage data from the video data is simply performed at the time of driving; thus, the offset voltage variation of the amplifier circuit 15 can be canceled.

The input voltage dependence of the offset voltages of the amplifier circuits 13 and 15 is less than 0.5 LSB (0.49 mV) in the $V_{LO}$ range of from 1.0 V to 6.75 V. This indicates that correction of the offset voltage by the semiconductor device 10 is effective.

Thus, it was shown that the semiconductor device 10 can operate without being influenced by the offset voltage.

Example 2

In this example, a driver IC for a signal line driver circuit was fabricated using the semiconductor device 10 described in Embodiment 1. Furthermore, an OLED panel was fabricated using the fabricated driver IC.

Table 1 shows the specifications of the fabricated driver IC.

TABLE 1

| | |
|---|---|
| Technology | 0.15 μm 1.8 V/4.5 V/9 V CMOS |
| Operating voltage | 1.8 V (logic) 8.0 V (analog) |
| Gamma reference | 1.0 V to 6.75 V |
| Gray scale | 12 bits |
| DNL | >−1 LSB |
| Channel area | 10.8 μm × 1700 μm (excluding external correction circuit) |
| External correction circuit | Integrated |

The output voltage amplitude of the fabricated driver IC is 5.75 V, and the gray scales are 12 bits. As described with reference to FIGS. 14A and 14B, the driver IC having the specifications of Table 1 includes a circuit that monitors the drain current of a driver transistor and corrects an image signal (such a circuit is referred to as an external correction circuit).

Figure 27:
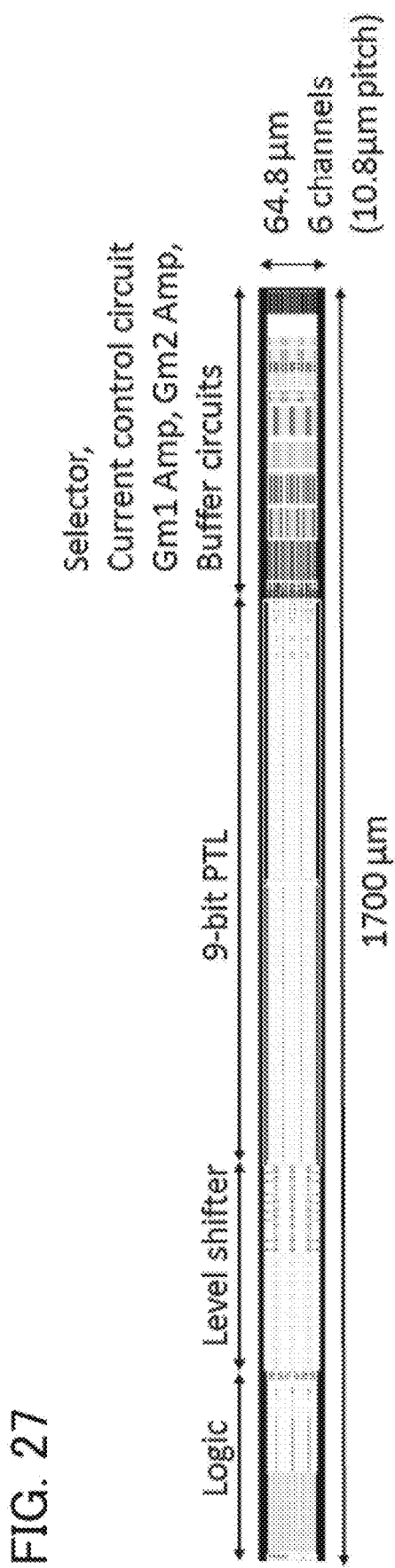
FIG. 27 shows a layout of a fabricated driver IC.

FIG. 27 shows a layout of six channels of the fabricated driver IC.

In addition, a 13.3-inch 8k4k 12-bit OLED panel was fabricated using the driver IC. Table 2 shows the specifications of the fabricated OLED panel.

TABLE 2

| | |
|---|---|
| Screen diagonal | 13.3 inches |
| Driving method | Active matrix |
| Number of effective pixels | 7680 × RGB × 4320 (8k4k) |
| Pixel density | 664 ppi |
| Pixel pitch | 12.75 μm × RGB × 38.25 μm |
| Frame rate | 120 Hz |
| Gray scale | 12 bits |
| Pixel arrangement | RGB stripe |
| Source driver | COG |
| Scan driver | Integrated |

An oxide semiconductor transistor was used for the OLED panel having the specifications of Table 2. The oxide semiconductor transistor has a top-gate self-aligned (TGSA) structure, such as the transistors 4010 and 4011 in FIGS. 21A and 21B.

Figure 28:
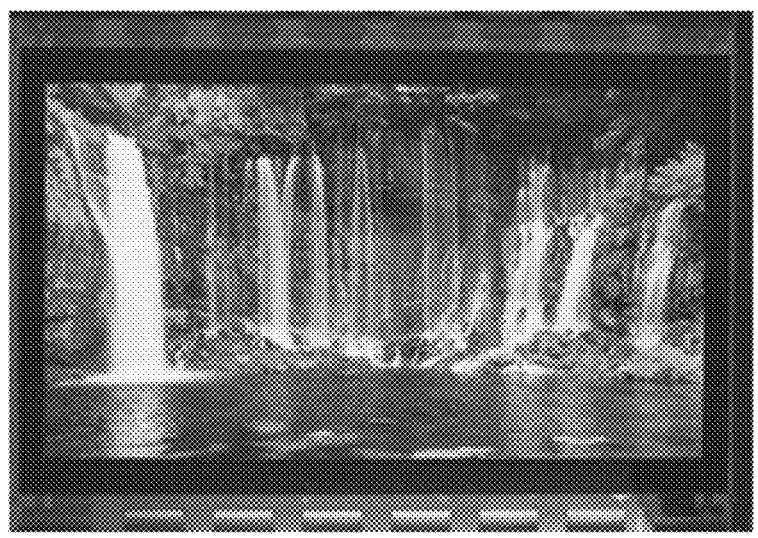
FIG. 28 shows a photograph of a fabricated OLED panel.

FIG. 28 is a photograph of the fabricated OLED panel. The fabricated OLED panel operated normally.

The 13.3-inch 8*k*4*k* 12-bit OLED panel including the semiconductor device 10 described in Embodiment I for the signal line driver circuit operated.

This application is based on Japanese Patent Application serial no. 2015-233540 filed with Japan Patent Office on Nov. 30, 2015, and Japanese Patent Application serial no. 2016-076529 filed with Japan Patent Office on Apr. 6, 2016, the entire contents of which are hereby incorporated by reference.

What is claimed is:

1. A semiconductor device comprising:
   a converter circuit having a first output terminal and a second output terminal;
   first to fourth switches;
   a first amplifier circuit having a first input terminal, a second input terminal, a first output terminal, and a second output terminal;
   a second amplifier circuit having a first input terminal, a second input terminal, a first output terminal, and a second output terminal; and
   a buffer circuit electrically connected to the first output terminals and the second output terminals of the first amplifier circuit and the second amplifier circuit,
   wherein the first output terminal of the converter circuit is electrically connected to the first switch and the fourth switch,
   wherein the second output terminal of the converter circuit is electrically connected to the second switch and the third switch,
   wherein the first input terminal of the first amplifier circuit is electrically connected to the first switch and the third switch,
   wherein each of the second input terminal of the first amplifier circuit and the first input terminal of the second amplifier circuit is electrically connected to the second switch and the fourth switch, and
   wherein the second input terminal of the second amplifier circuit is electrically connected to an output terminal of the buffer circuit.

2. The semiconductor device according to claim 1,
   wherein the converter circuit further has a input terminal configured to be input with a first digital signal, and
   wherein the converter circuit is configured to output a first voltage via the first output terminal and a second voltage via the second output terminal.

3. The semiconductor device according to claim 2,
   wherein the first voltage is higher than the second voltage.

4. The semiconductor device according to claim 2,
   wherein when the first switch and the second switch are turned on, the first voltage is supplied to the first input terminal of the first amplifier circuit, and the second voltage is supplied to the second input terminal of the first amplifier circuit and the first input terminal of the second amplifier circuit.

5. The semiconductor device according to claim 4,
   wherein the third switch and the fourth switch are turned off when the first switch and the second switch are turned on.

6. The semiconductor device according to claim 2,
   wherein when the first switch and the second switch are turned off, the first voltage is supplied to the first input terminal of the first amplifier circuit, and the second voltage is supplied to the second input terminal of the first amplifier circuit and the first input terminal of the second amplifier circuit.

7. The semiconductor device according to claim 6,
   wherein the third switch and the fourth switch are turned on when the first switch and the second switch are turned off.

8. The semiconductor device according to claim 1,
   wherein the converter circuit is a digital-to-analog converter circuit.

9. The semiconductor device according to claim 1, further comprising:
   a current control circuit directly connected to the first amplifier circuit,
   wherein the current control circuit is configured to be input a second digital signal.

10. The semiconductor device according to claim 1, further comprising: a current source directly connected to the second amplifier circuit.

11. A display panel comprising:
    the semiconductor device according to claim 1; and
    a display portion.

12. A display module comprising:
    the display panel according to claim 11; and
    a touch panel.

13. An electronic device comprising:
    the display panel according to claim 11; and
    at least one of an operation button, a speaker, and a microphone.

14. The semiconductor device according to claim 1,
    wherein each of the first input terminals of the first amplifier circuit and the second amplifier circuit is a non-inverting input terminal, and
    wherein each of the second input terminals of the first amplifier circuit and the second amplifier circuit is an inverting input terminal.

15. A semiconductor device comprising:
    a converter circuit having a first output terminal and a second output terminal;
    first to fourth switches;
    a first amplifier circuit having a first input terminal and a second input terminal;
    a second amplifier circuit having a first input terminal and a second input terminal; and
    a buffer circuit electrically connected to the first amplifier circuit and the second amplifier circuit,
    wherein the first output terminal of the converter circuit is electrically connected to the first input terminal of the first amplifier circuit through the first switch,
    wherein the first output terminal of the converter circuit is electrically connected to the first input terminal of the second amplifier circuit through the fourth switch,
    wherein the second output terminal of the converter circuit is electrically connected to the first input terminal of the first amplifier circuit through the third switch,
    wherein the second output terminal of the converter circuit is electrically connected to the second input terminal of the first amplifier circuit and the first input terminal of the second amplifier circuit through the second switch,
    wherein the second input terminal of the second amplifier circuit is electrically connected to an output terminal of the buffer circuit,
    wherein each of the first input terminals of the first amplifier circuit and the second amplifier circuit is a non-inverting input terminal, and
    wherein each of the second input terminals of the first amplifier circuit and the second amplifier circuit is an inverting input terminal.

16. The semiconductor device according to claim 15,
wherein the converter circuit further has a input terminal configured to be input with a first digital signal, and
wherein the converter circuit is configured to output a first voltage via the first output terminal and a second voltage via the second output terminal.

17. The semiconductor device according to claim 16,
wherein the first voltage is higher than the second voltage.

18. The semiconductor device according to claim 16,
wherein when the first switch and the second switch are turned on, the first voltage is supplied to the first input terminal of the first amplifier circuit, and the second voltage is supplied to the second input terminal of the first amplifier circuit and the first input terminal of the second amplifier circuit.

19. The semiconductor device according to claim 18,
wherein the third switch and the fourth switch are turned off when the first switch and the second switch are turned on.

20. The semiconductor device according to claim 16,
wherein when the first switch and the second switch are turned off, the first voltage is supplied to the first input terminal of the first amplifier circuit, and the second voltage is supplied to the second input terminal of the first amplifier circuit and the first input terminal of the second amplifier circuit.

21. The semiconductor device according to claim 20,
wherein the third switch and the fourth switch are turned on when the first switch and the second switch are turned off.

22. The semiconductor device according to claim 15,
wherein the converter circuit is a digital-to-analog converter circuit.

23. The semiconductor device according to claim 15,
further comprising a current control circuit directly connected to the first amplifier circuit,
wherein the current control circuit is configured to be input a second digital signal.

24. The semiconductor device according to claim 15,
further comprising a current source directly connected to the second amplifier circuit.

25. A display panel comprising:
the semiconductor device according to claim 15; and
a display portion.

26. A display module comprising:
the display panel according to claim 25; and
a touch panel.

27. An electronic device comprising:
the display panel according to claim 25; and
at least one of an operation button, a speaker, and a microphone.

28. The semiconductor device according to claim 15,
wherein the first amplifier circuit further has a first output terminal and a second output terminal,
wherein the second amplifier circuit further has a first output terminal and a second output terminal, and
wherein the buffer circuit is electrically connected to the first output terminals and the second output terminals of the first amplifier circuit and the second amplifier circuit.

* * * * *